United States Patent
Kim et al.

(10) Patent No.: US 8,610,346 B2
(45) Date of Patent: Dec. 17, 2013

(54) ORGANIC LIGHT-EMITTING DEVICE INCLUDING AN ALUMINUM-BASED REFLECTIVE LAYER

(75) Inventors: Tae-Shick Kim, Yongin (KR); Dong-Heon Kim, Yongin (KR); Kwan-Hee Lee, Yongin (KR); Byung-Hoon Chun, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 180 days.

(21) Appl. No.: 12/902,301

(22) Filed: Oct. 12, 2010

(65) Prior Publication Data

US 2011/0084600 A1    Apr. 14, 2011

(30) Foreign Application Priority Data

Oct. 12, 2009  (KR) .................. 10-2009-0096820

(51) Int. Cl.
  *H01J 1/62*   (2006.01)
  *H01J 63/04*  (2006.01)

(52) U.S. Cl.
  USPC .......................................... 313/504; 313/503

(58) Field of Classification Search
  USPC .................... 313/504, 506, 503; 428/690
  See application file for complete search history.

(56) References Cited

U.S. PATENT DOCUMENTS

| | | | | |
|---|---|---|---|---|
| 5,458,753 A | * | 10/1995 | Sato et al. | 204/192.29 |
| 2002/0117962 A1 | * | 8/2002 | Beierlein et al. | 313/504 |
| 2005/0008893 A1 | * | 1/2005 | Kato | 428/690 |
| 2005/0045873 A1 | | 3/2005 | Alvarado et al. | |
| 2005/0088080 A1 | | 4/2005 | Cheng et al. | |
| 2005/0247946 A1 | * | 11/2005 | Shin | 257/88 |
| 2006/0076885 A1 | | 4/2006 | Kim et al. | |
| 2006/0118768 A1 | * | 6/2006 | Liu et al. | 252/500 |
| 2006/0251924 A1 | * | 11/2006 | Lu et al. | 428/690 |
| 2007/0202356 A1 | * | 8/2007 | Okada | 428/690 |
| 2009/0004490 A1 | | 1/2009 | Gotou et al. | |

(Continued)

FOREIGN PATENT DOCUMENTS

JP    2009-052351 A    3/2009
KR  10 2005-0097670 A  10/2005

(Continued)

OTHER PUBLICATIONS

Kugimiya, et al.; P-149: Anode Electrode of Al-Ni Alloy Film Directly in Contact with ITO for Top-Emitting OLEDs; SID International Symposium; May 31, 2009; pp. 1681-1684; SID 09 Digest; Society for Information Display, Los Angeles, CA.

(Continued)

*Primary Examiner* — Mariceli Santiago
*Assistant Examiner* — Glenn Zimmerman
(74) *Attorney, Agent, or Firm* — Lee & Morse, P.C.

(57) ABSTRACT

An organic light-emitting device including a substrate; a first electrode on the substrate; a second electrode; an organic layer between the first electrode and the second electrode; and a carbonaceous material-containing layer between the first electrode and the organic layer, wherein the first electrode includes an aluminum (Al)-based reflective layer and a transparent conductive layer sequentially stacked in this order on the substrate, the Al-based reflective layer including a first element and nickel (Ni) and the first element includes at least one of lanthanum (La), cerium (Ce), praseodymium (Pr), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

19 Claims, 5 Drawing Sheets

(56) References Cited

U.S. PATENT DOCUMENTS

2009/0200913 A1    8/2009  Kim et al.
2010/0231116 A1    9/2010  Ochi et al.
2010/0301368 A1*  12/2010  Im et al. .................... 257/98

FOREIGN PATENT DOCUMENTS

| KR | 10 2006-0032099 A | 4/2006 |
|----|-------------------|--------|
| KR | 10 2007-0044308 A | 4/2007 |
| KR | 10 2007-0071978 A | 7/2007 |
| KR | 10 2008-0045629 A | 5/2008 |
| KR | 10 2008-0114575 A | 12/2008 |
| KR | 10 2009-0087692 A | 8/2009 |
| WO | WO 2009-081992 A1 | 7/2009 |

OTHER PUBLICATIONS

European Search Report in EP 10187087.1-1235/2309566, dated Sep. 16, 2011 (Kim, et al.).

* cited by examiner

ORGANIC LIGHT-EMITTING DEVICE INCLUDING AN ALUMINUM-BASED REFLECTIVE LAYER

BACKGROUND

1. Field

Embodiments relate to an organic light-emitting device.

2. Description of the Related Art

Organic light-emitting devices (OLEDs), which are self-emitting devices, have advantages, e.g., a wide viewing angle, excellent contrast, quick response, high brightness, excellent driving voltage characteristics, and an ability to provide multicolored images.

A typical OLED has a structure including, e.g., a substrate, and an anode, a hole transport layer (HTL), an emission layer (EML), an electron transport layer (ETL), and a cathode, which are sequentially stacked on the substrate. In this regard, the HTL, the EML, and the ETL may be organic thin films formed of organic compounds.

An operating principle of an OLED having the above-described structure is as follows.

When a voltage is applied to the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

Embodiments are directed to an organic light-emitting device, which represents advances over the related art.

It is a feature of an embodiment to provide an organic light-emitting device (OLED) having excellent efficiency and power consumption characteristics.

It is another feature of an embodiment to provide an organic light-emitting device (OLED) having excellent image quality.

At least one of the above and other features and advantages may be realized by providing an organic light-emitting device including a substrate; a first electrode on the substrate; a second electrode; an organic layer between the first electrode and the second electrode; and a carbonaceous material-containing layer between the first electrode and the organic layer, wherein the first electrode includes an aluminum (Al)-based reflective layer and a transparent conductive layer sequentially stacked in this order on the substrate, the Al-based reflective layer including a first element and nickel (Ni) and the first element includes at least one of lanthanum (La), cerium (Ce), praseodymium (Pr), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The Al-based reflective layer may include an $Al_xNi$ phase, x being about 2.5 to about 3.5.

The $Al_xNi$ phase may contact the transparent conductive layer.

x may be about 3.

The organic light-emitting device may further include a nickel (Ni)-rich oxide layer on a surface of the Al-based reflective layer that faces the transparent conductive layer.

The nickel (Ni) may be included in the Al-based reflective layer in an amount of about 0.6 wt % to about 5 wt %.

The first element may be lanthanum (La).

The first element may be included in the Al-based reflective layer in an amount of about 0.1 wt % to about 3 wt %.

The Al-based reflective layer may include lanthanum (La), nickel (Ni), and aluminum (Al), the lanthanum (La) may be included in the Al-based reflective layer in an amount of about 0.1 wt % to about 3 wt %, and the nickel (Ni) may be included in the Al-based reflective layer in an amount of about 0.6 wt % to about 5 wt %.

The transparent conductive layer may include indium tin oxide (ITO) or tin oxide ($SnO_2$).

The carbonaceous material-containing layer may include a carbonaceous material including at least one of a fullerene-based compound, a metal-containing fullerene-based complex, carbon nanotubes, carbon fiber, carbon black, graphite, carbine, $MgC_{60}$, $CaC_{60}$, and $SrC_{60}$.

The carbonaceous material may include $C_{60}$.

The first electrode may further include a second element-containing zinc oxide layer, the second element in the second element-containing zinc oxide layer including at least one of aluminum (Al), indium (In), gallium (Ga), germanium (Ge), gadolinium (Gd), zirconium (Zr), molybdenum (Mo), and nickel (Ni).

The second element may include aluminum (Al).

The Al-based reflective layer including the first element and nickel (Ni), the transparent conductive layer, and the second element-containing zinc oxide layer may be sequentially stacked in this order on the substrate.

The second element may be included in the second element-containing zinc oxide layer in an amount of about 0.5 to about 10 parts by weight, based on 100 parts by weight of the second element-containing zinc oxide layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
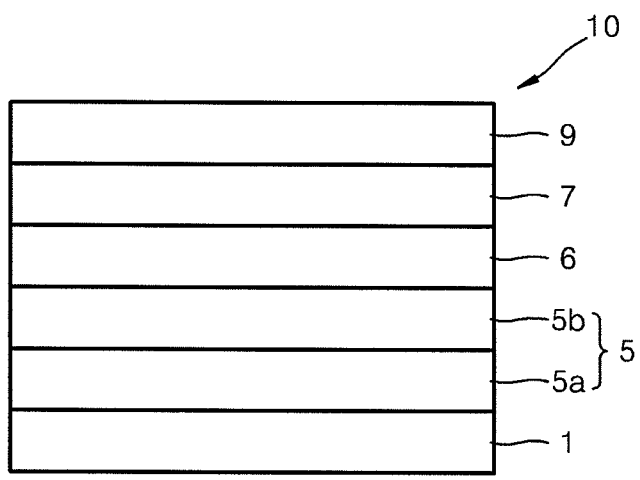
FIG. 1 illustrates a cross-sectional view of a structure of an organic light-emitting device (OLED) according to an embodiment.

Korean Patent Application No. 10-2009-0096820, filed on Oct. 12, 2010, in the Korean Intellectual Property Office, and entitled: "Organic Light-Emitting Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a schematic sectional view of an organic light-emitting device (OLED) 10 according to an embodiment. Referring to FIG. 1, the OLED 10 according to the present embodiment may include a substrate 1, a first electrode 5, a carbonaceous material-containing layer 6, an organic layer 7, and a second electrode 9, which are sequentially stacked in this order. The first electrode 5 may include an aluminum (Al)-based reflective layer 5a and a transparent conductive layer 5b sequentially stacked on the substrate 1. The Al-based reflective layer 5a may include Al, a first element, and nickel (Ni).

The substrate 1, which may be any substrate suitable for organic light emitting devices, may be a glass substrate or a transparent plastic substrate with excellent mechanical strength, thermal stability, transparency, surface smoothness, ease of handling, and water impermeability.

The first element in the Al-based reflective layer 5a may include at least one of, e.g., lanthanum (La), cerium (Ce), praseodymium (Pr), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The Al-based reflective layer 5a may have a high reflexibility and/or reflectance, and thus may improve luminescent efficiency of the OLED. In addition, the Al-based reflective layer 5a may have high thermal stability due to inherent properties of Al. Thus, the Al-based reflective layer 5a may have excellent durability even when exposed to a high-temperature manufacturing process. In addition, the Al-based reflective layer 5a may have excellent adhesive characteristics with respect to an organic layer or an inorganic layer formed adjacent thereto.

The Al-based reflective layer 5a and the transparent conductive layer 5b may contact each other. However, galvanic corrosion caused by a potential difference between the Al-based reflective layer 5a and the transparent conductive layer 5b may substantially not occur.

In particular, galvanic corrosion may occur due to a potential difference between two different metals adjacent to each other, thereby causing current to flow and electricity to be generated. One of two different metals electrically in contact with each other having a relatively greater activity (lower potential) due to different work functions at the interface thereof may function as a cathode and the other one having a relatively lower activity (greater potential) may function as an anode. When the two metals are exposed to a corrosive solution, both metals may be corroded due to the potential difference therebetween. This is referred to as galvanic corrosion. The cathode having a greater activity may be corroded faster than when exclusively used. The anode having a lower activity may be corroded slower than when exclusively used. As galvanic corrosion spreads along an interface of the two electrode layers formed of different metals, contact resistance between the two electrodes may be abruptly increased. Thus, the contact resistance may be very unstably distributed. Accordingly, when an OLED including two such electrode layers is operated, pixels of the OLED may display colors with inconsistent luminance. Due to this non-uniform luminance, image quality may be significantly lowered. As such, galvanic corrosion may be a quality deterioration factor in OLEDs.

However, since the Al-based reflective layer 5a includes the first element, which will be described later in detail, such galvanic corrosion may substantially not occur at the interface between the Al-based reflective layer 5a and the transparent conductive layer 5b. Thus, the OLED according to the current embodiment may have excellent image quality.

The Al-based reflective layer 5a may include nickel (Ni). In particular, the Al-based reflective layer 5a may include an $Al_xNi$ phase wherein x is about 2.5 to about 3.4 or 3.5.

Figure 2A:
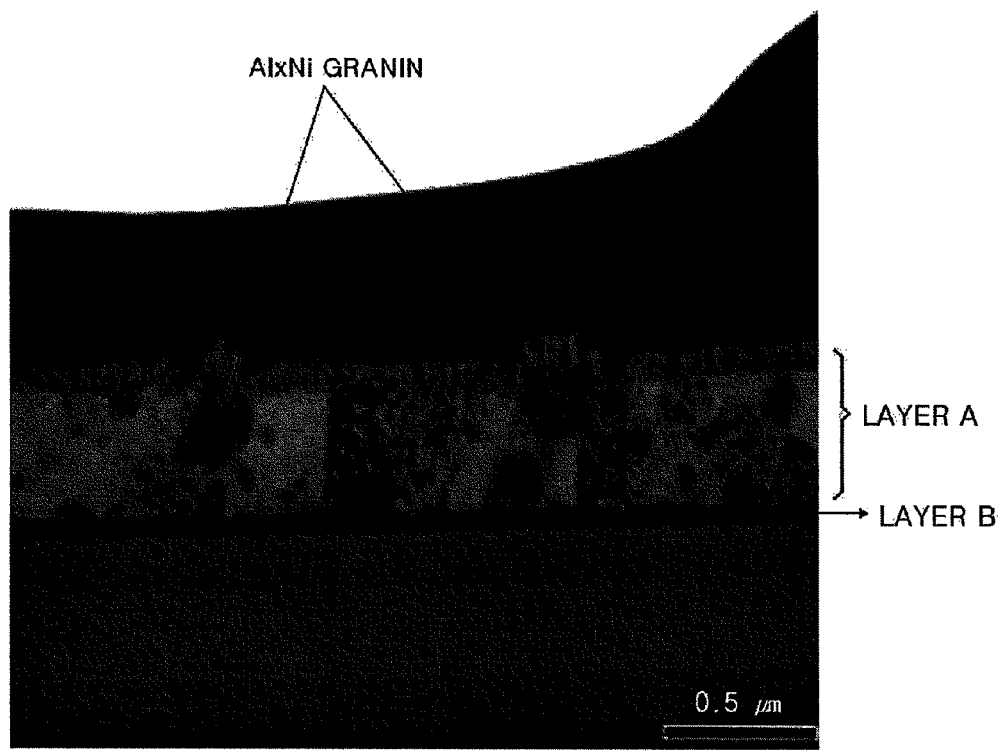
FIG. 2A illustrates a transmission electron microscopic (TEM) image of a cross-section of an aluminum (Al)-based reflective layer according to an embodiment.
Figure 2B:
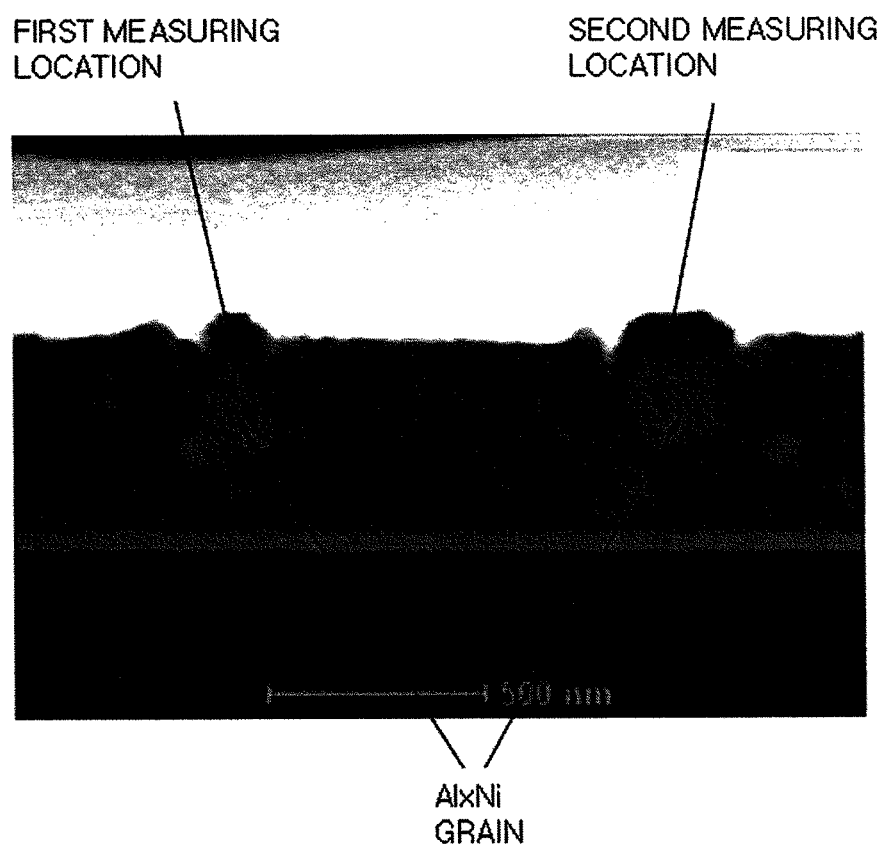
FIG. 2B illustrates a scanning transmission electron microscope (STEM)-high-angle annular dark-field (HAADF) image of the aluminum (Al)-based reflective film of FIG. 2A.
Figure 2C:
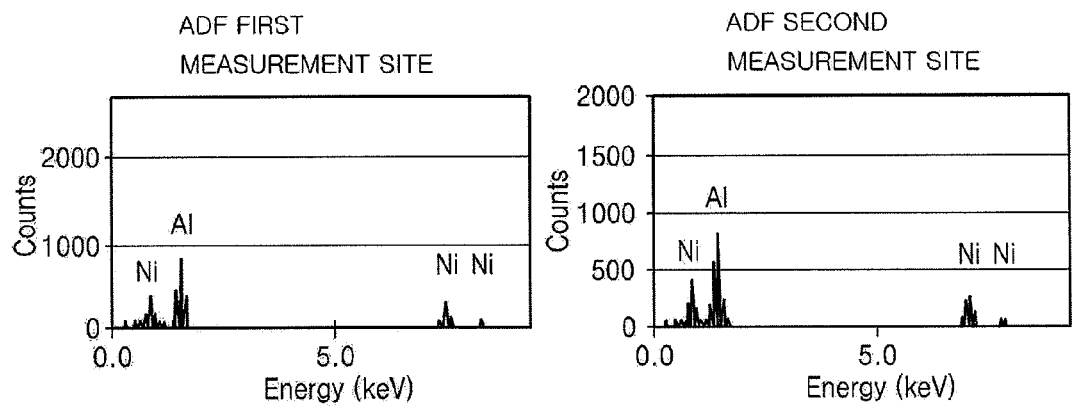
FIG. 2C illustrates a result of energy dispersive X-ray spectroscopy on abnormally grown crystals of FIG. 2B.

FIGS. 2A and 2B illustrate a transmission electron microscopic (TEM) image of a cross-section of an Al-based reflective layer (layer A) formed on a titanium (Ti) layer (layer B), wherein the Al-based reflective layer includes 2 wt % of nickel (Ni) and 0.35 wt % of lanthanum (La). FIG. 2C illustrates a result of semi-quantitative energy dispersive X-ray spectroscopy (EDS) on abnormally grown $Al_xNi$ crystals (at first and second measurement sites) in FIG. 2B. As illustrated in FIG. 2C, the abnormally grown $Al_xNi$ crystals in FIG. 2B includes Al and Ni in a ratio of Al(K):Ni(K)=73:27 (in atomic %). Thus, the Al-based reflective layer presumably includes an $Al_xNi$ phase wherein x is about 3.

The $Al_xNi$ phase, wherein x is about 2.5 to about 3.5, may contact the transparent conductive layer 5b.

In an implementation, a Ni-rich oxide layer may be further disposed on a surface of the Al-based reflective layer 5a facing the transparent conductive layer 5b.

Figure 3:
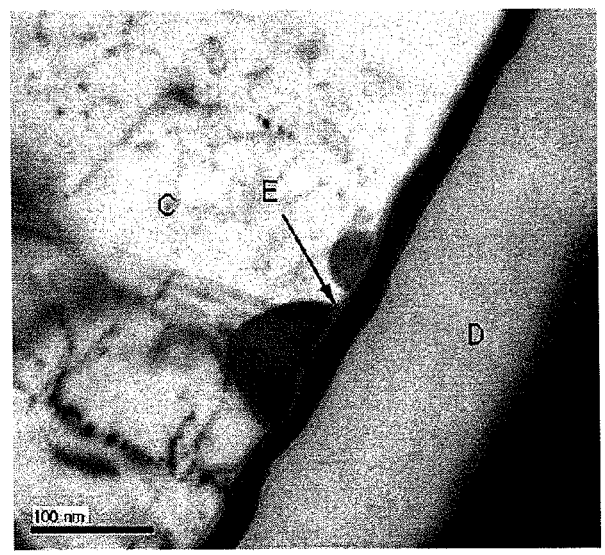
FIG. 3 illustrates a TEM image of a cross-section of a first electrode according to another embodiment.

FIG. 3 illustrates a TEM image of a cross-section of a structure including an Al-based reflective layer (region C) and a transparent ITO conductive layer (region D) sequentially formed on a TFT substrate, wherein the Al-based reflective layer includes 2 wt % of nickel (Ni) and 0.35 wt % of lanthanum (La). In FIG. 3, a linear region, denoted by "E", between the Al-based reflective layer and the transparent ITO conductive layer, corresponds to a Ni-rich oxide layer having a thickness of about 7 nm to about 8 nm.

Due to the $Al_xNi$ phase, wherein x is about 2.5 to about 3.5, and the Ni-rich oxide layer described above, ohmic contact may be realized between the Al-based reflective layer 5a and the transparent conductive layer 5b.

The Ni may be included in the Al-based reflective layer 5a in an amount of about 0.6 wt % to about 5 wt %, e.g., about 1 wt % to about 4 wt %. Maintaining the amount of Ni in the Al-based reflective layer 5a at about 0.6 wt % to about 5 wt % may help ensure that the contact resistance between the Al-based reflective layer 5a and the transparent conductive layer 5b may be stabilized and reflectivity and resistance to chemicals of the Al-based reflective layer 5a may be substantially not reduced. In an implementation, the amount of Ni in the Al-based reflective layer 5a may be about 2 wt %. The amount of Ni in the Al-based reflective layer 5a is not limited to the above amounts.

The Al-based reflective layer 5a may include the first element, in addition to Ni having such a function as described above. The first element may include, e.g., lanthanum (La), cerium (Ce), praseodymium (Pr), promethium (Pm), samarium (Sm), europium (Eu), gadolinium (Gd), terbium (Tb), dysprosium (Dy), holmium (Ho), erbium (Er), thulium (Tm), ytterbium (Yb), and/or lutetium (Lu).

Since the Al-based reflective layer 5a may include the first element, the Al-based reflective layer 5a may have excellent thermal stability and galvanic corrosion may be advantageously suppressed. In an implementation, the first element may include lanthanum (La).

The first element may be included in the Al-based reflective layer 5a in an amount of about 0.1 wt % to about 3 wt %, e.g., about 0.1 wt % to about 1 wt %. Maintaining the amount of the first element at about 0.1 wt % to about 3 wt % may help ensure that neither the thermal stability of Al in the Al-based reflective layer 5a nor the reflectivity of the Al-based reflective layer 5a is substantially reduced. The amount of the first element is not limited to the above range. In an implementation, the amount of the first element may be, e.g., about 0.30 wt % to about 0.35 wt %.

The Al-based reflective layer 5a may have a thickness of about 50 nm or greater, e.g., about 100 nm to about 500 nm. Maintaining the thickness of the Al-based reflective layer 5a at about 50 nm or greater may help ensure that light generated in the organic layer 7 does not pass through the Al-based reflective layer 5a, so that the luminescent efficiency of the OLED is not substantially reduced.

The transparent conductive layer 5b may be formed of a transparent conductive metal oxide. The transparent conductive metal oxides may include, e.g., ITO and tin oxide ($SnO_2$), but are not limited thereto. In an implementation, the transparent conductive layer 5b may be formed of ITO.

The transparent conductive layer 5b may have a thickness of about 5 nm to about 100 nm, e.g., about 7 nm to about 80 nm. Maintaining the thickness of the transparent conductive layer 5b at about 5 nm to about 100 nm may help ensure that a reduction in the reflectivity of the Al-based reflective layer 5a is minimized and the OLED has excellent efficiency.

The carbonaceous material-containing layer 6 may be formed on the transparent conductive layer 5a. The carbonaceous material-containing layer 6 may effectively inject and transport holes from the first electrode 5 into the organic layer 7. Thus, the OLED including the Al-based reflective layer 5a and the transparent conductive layer 5b in the first electrode 5 as described above may have excellent efficiency and power consumption characteristics. A high refractive index (>1.8) of the carbonaceous material-containing layer 6, which is high enough to compensate for a phase difference of light reflected from the Al-based reflective layer 5a, may also provide excellent efficiency and power consumption characteristics to the OLED.

A carbonaceous material in the carbonaceous material-containing layer 6 may include, e.g., an allotrope of carbon consisting of about 50 to about 600 carbon atoms or a metal-containing carbonaceous compound. The carbonaceous material may include, e.g., a fullerene-based compound, a metal-containing fullerene-based complex, carbon nanotubes, carbon fiber, carbon black, graphite, carbine, $MgC_{60}$, $CaC_{60}$, and/or $SrC_{60}$, but are not limited thereto In an implementation, the carbonaceous material may be a $C_{60}$-$C_{500}$ fullerene-based compound, e.g., $C_{60}$.

The carbonaceous material-containing layer 6 may have a thickness of about 1 Å to about 300 Å. Maintaining the thickness of the carbonaceous material-containing layer 6 at about 1 Å to about 300 Å may help ensure that an OLED emitting red, green, and/or blue light having high color purity at a high efficiency is attained. In an implementation, the carbonaceous material-containing layer 6 may have a thickness of about 3 Å to about 100 Å. In another implementation, the carbonaceous material-containing layer 6 may have a thickness of about 3 Å to about 30 Å.

The organic layer 7 may be formed on the carbonaceous material-containing layer 6, as described above. The term "organic layer" used throughout the specification refers to any intervening layer between the first electrode 5 and the second electrode 9. The organic layer 7 may not be formed of pure organic materials and may include a metal complex.

The organic layer 7 may include at least one layer selected from the group consisting of a hole injection layer (HIL), a hole transport layer (HTL), an emission layer (EML), a hole blocking layer (HBL), an electron transport layer (ETL) and an electron injection layer (EIL).

The organic layer 7 may have a stacked structure including, e.g., a HIL, a HTL, an EML, an ETL, and an EIL, which are stacked in this order on the carbonaceous material-containing layer 6. Alternatively, the organic layer 7 may have a stacked structure including, e.g., a HTL, an EML, an ETL, and an EIL, which are stacked in this order on the carbonaceous material-containing layer 6.

The HIL may be formed on the carbonaceous material-containing layer 6 by using, e.g., vacuum deposition, spin coating, casting, Langmuir-Blodgett (LB) deposition, or the like.

When the HIL is formed using vacuum deposition, deposition conditions may vary according to a compound that is used to form the HIL and the structure and thermal properties of the HIL to be formed. In general, however, conditions for vacuum deposition may include a deposition temperature of about 100 to about 500° C., a vacuum pressure of about $10^{-8}$ to about $10^{-3}$ torr, and a deposition rate of about 0.01 to about 100 Å/sec.

When the HIL is formed using spin coating, the coating conditions may vary according to a compound that is used to form the HIL, and the structure and thermal properties of the HIL to be formed. In general, however, conditions for spin coating may include a coating rate of about 2,000 to about 5,000 rpm and a heat treatment temperature of about 80 to about 200° C., wherein the heat treatment is performed to remove a solvent after coating.

The HIL may be formed of any material suitable for forming a HIL. The material for forming the HIL may include, e.g., a phthalocyanine compound such as copper phthalocyanine, 4,4',4"-tris(3-methylphenylphenylamino) triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline/poly(4-styrenesulfonate (PANI/PSS), but are not limited thereto.

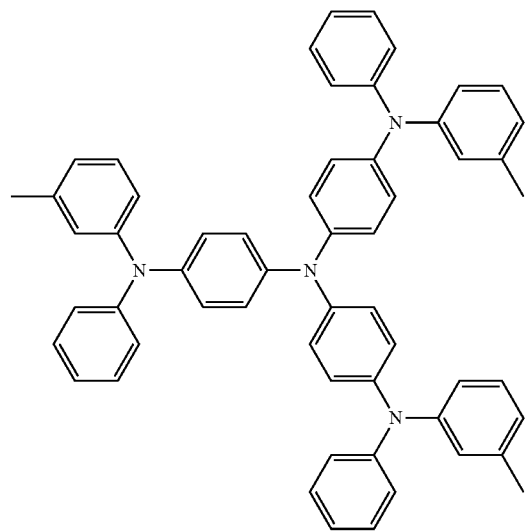

m-MTDATA

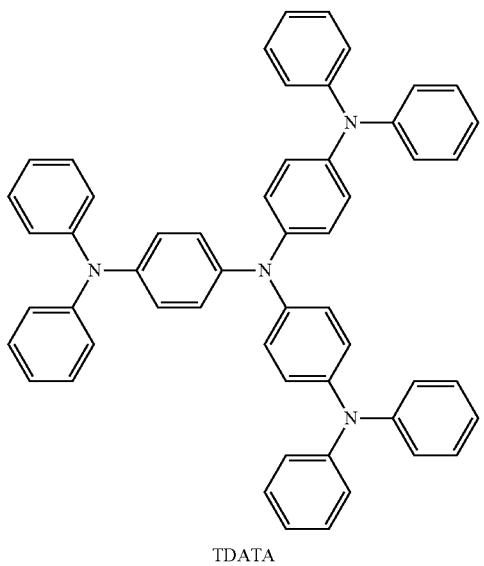

TDATA

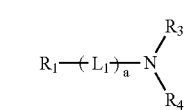

2T-NATA

The HIL may have a thickness of about 50 Å to about 10,000 Å, e.g., a thickness of about 50 Å to about 2,500 Å. Maintaining the thickness of the HIL at about 50 Å to about 10,000 Å may help ensure that the HIL has an excellent hole injecting ability without a substantial increase in driving voltage.

Then, a HTL may be formed on the HIL by using, e.g., vacuum deposition, spin coating, casting, Langmuir-Blodgett (LB) deposition, or the like. When the HTL is formed using vacuum deposition or spin coating, the conditions for deposition and coating may be similar to those for the formation of the HIL, although the conditions for the deposition and coating may vary according to the material that is used to form the HTL.

A material for forming the HTL may be a compound represented by Formula 41 or 42 below.

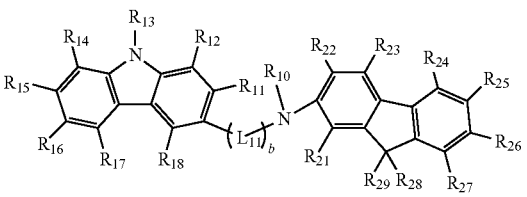

Formula 41

Formula 42

In Formulae 41 and 42, $R_{10}$ may be —$(Ar_1)_n$—$Ar_2$. $R_{16}$ may be —$(Ar_{11})_m$—$Ar_{12}$—$Ar_1$, $Ar_{11}$, $L_1$ and $L_{11}$ may each independently be, e.g., a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_4$-$C_{30}$ heteroarylene group, and/or a group represented by —N($Q_1$)-. n, m, a, and b may each independently be an integer from 0 to 10. $R_1$ through $R_3$, $R_{11}$ through $R_{15}$, $R_{17}$, $R_{18}$, $R_{21}$ through $R_{29}$, $Ar_2$, $Ar_{12}$, and $Q_1$ may each independently be, e.g., hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, a substituted or unsubstituted $C_4$-$C_{30}$ heteroaryl group, and a group represented by —N($Q_2$)($Q_3$). $Q_2$ and $Q_3$ may each independently be hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, and a substituted or unsubstituted $C_4$-$C_{30}$ heteroaryl group, wherein n groups of $Ar_1$ in —$(Ar_1)_n$— are identical to or different from each other, m groups of $Ar_{11}$ in —$(Ar_{11})_m$— are identical to or different from each other, a groups of $L_1$ in -($L_1$)a- are identical to or different from each other, and b groups of $L_{11}$ in -($L_{11}$)$_b$- are identical to or different from each other.

Examples of $Ar_1$ in the formula —$(Ar_1)_n$—$Ar_2$— for $R_{10}$ and $Ar_{11}$ in the formula —$(Ar_{11})_m$—$Ar_{12}$— for $R_{16}$ may include a substituted or unsubstituted $C_1$-$C_{10}$ alkylene group, a substituted or unsubstituted $C_2$-$C_{10}$ alkenylene group, a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, a substituted or unsubstituted triazinylene group, and a group represented by $—N(Q_1)-$, but are limited thereto. In this regard, $Q_1$ may include, e.g., hydrogen, a halogen atom, a hydroxyl group, a cyano group, a substituted or unsubstituted $C_1-C_{10}$ alkyl group, a substituted or unsubstituted $C_2-C_{10}$ alkenyl group, a substituted or unsubstituted $C_2-C_{10}$ alkynyl group, a substituted or unsubstituted $C_1-C_{10}$ alkoxy group, a substituted or unsubstituted $C_1-C_{10}$ alkylthiol group, a substituted or unsubstituted $C_5-C_{14}$ acyl group, and a substituted or unsubstituted $C_4-C_{14}$ heteroaryl group, but is not limited thereto.

For example, $Ar_1$ and $Ar_{11}$ may each independently be a $C_1-C_{10}$ alkylene group; a phenylene group; a naphthylene group; an anthrylene group; a fluorenylene group; a carbazolylene group; a pyrazolylene group; a pyridinylene group; a triazinylene group; $—N(Q_1)-$; a substituted $C_1-C_{10}$ alkylene group, a substituted phenylene group, a substituted naphthylene group, a substituted anthrylene group, a substituted fluorenylene group, a substituted carbazolylene group, a substituted pyrazolylene group, a substituted pyridinylene group, and a substituted triazinylene group which have at least one substituent including a halogen atom, a cyano group, a hydroxyl group, a $C_1-C_{10}$ alkyl group, a $C_1-C_{10}$ alkoxy group, a phenyl group, a naphthyl group, and/or an anthryl group. In this regard, $Q_1$ may include, e.g., hydrogen; a $C_1-C_{10}$ alkyl group; a phenyl group; a naphthyl group; a carbazolyl group; a fluorenyl group; and a substituted $C_1-C_{10}$ alkyl group, a substituted $C_1-C_{10}$ alkoxy group, a substituted phenyl group, a substituted naphthyl group, a substituted carbazolyl group, and/or a substituted fluorenyl group that have at least one substituent selected from the group consisting of a halogen atom, a cyano group, a hydroxyl group, a $C_1-C_{10}$alkyl group, a $C_1-C_{10}$ alkoxy group, a phenyl group, a naphthyl group, and/or an anthryl group.

$Ar_2$ in the formula $—(Ar_1)_n—Ar_2—$ and $Ar_{12}$ in the formula $—(Ar_{11})m-Ar_{12}—$ may be as defined above in connection with $Q_1$.

n in the formula $—(Ar_1)_n—Ar_2-$ and m in the formula $—(Ar_{11})_m—Ar_{12}—$ may each independently be an integer from 0 to 6. For example, n and m may each independently be 0, 1, 2, 3, 4, or 5.

n groups of $Ar_1$ in the formula $—(Ar_1)_n—Ar_2—$ may be identical to or different from each other. For example, when n is 2, the two groups of $Ar_1$ in $—(Ar_1)_n—$ may be both phenylene groups, or one of the two may be $—N(Q_1)-$ and the other may be a phenylene group. This interpretation may be applied to $—(Ar_{11})_m—Ar_{12}—$.

$R_1$ through $R_3$, $R_{11}$ through $R_{15}$, $R_{17}$, $R_{18}$, and $R_{21}$ through $R_{29}$ in Formulae 41 and 42 may be defined as described above in connection with $Q_1$.

For example, $R_{13}$ may be a phenyl group, a naphthyl group, or an anthryl group, but is not limited thereto.

For example, $R_{28}$ and $R_{29}$ may each independently be hydrogen, a methyl group, an ethyl group, a methoxy group, an ethoxy group, a phenyl group, a naphthyl group, and/or an anthryl group, but are not limited thereto.

$L_1$ and $L_2$ in Formulae 41 and 42 may be defined as described above in connection with $Ar_1$ and $Ar_{11}$.

For example, $L_1$ and $L_2$ may each independently be a phenylene group, a $C_1-C_{10}$ alkylphenylene group, a fluorophenylene group, a carbazolylene group, a triazinylene group, a $C_1-C_{10}$ alkyltriazinylene group, a phenyltriazinylene group, $C_1-C_{10}$alkylene group, or a phenylcarbazolylene group, but are not limited thereto.

In Formulae 41 and 42, a and b may each independently be an integer from 0 to 10. For example, a and b may each independently be 0, 1, 2, or 3, but are not limited thereto.

For example, in Formula 42, $Ar_1$ in the formula $—(Ar_1)_n—Ar_2—$ for $R_{10}$ and $Ar_{11}$ in the formula $—(Ar_{11})_m—Ar_{12}—$ for $R_{16}$ may each independently be a phenylene group; a carbazolylene group; a fluorenylene group; a methylfluorenylene group; a pyrazolylene group; a phenylpyrazolylene group; $—N(Q_1)-$, wherein $Q_1$ is hydrogen, a phenyl group, a fluorenyl group, a dimethylfluorenyl group, a diphenylfluorenyl group, a carbazolyl group, or a phenylcarbazolyl group; a diphenylfluorenylene group; a triazinylene group; a methyltriazinylene group; a phenyltriazinylene group; a tetrafluorophenylene group; an ethylene group; and/or a methylphenylene group, wherein n and m are each independently 0, 1, 2, 3, 4, 5, or 6, and $Ar_2$ and $Ar_{12}$ are each independently hydrogen, a cyano group, a fluoro group, a phenyl group, a cyanophenyl group, a naphthyl group, an anthryl group, a methyl group, a pyridinyl group, a carbazolyl group, a phenylcarbazolyl group, a fluorenyl group, a dimethylfluorenyl group, and/or a diphenylfluorenyl group. $R_{11}$, $R_{12}$, $R_{14}$, $R_{15}$, $R_{17}$, $R_{18}$, $R_{21}$ through $R_{27}$ may be hydrogen. $R_{13}$ may include a phenyl group, a naphthyl group, and/or an anthryl group. $R_{28}$ and $R_{29}$ may each independently be hydrogen, a methyl group, an ethyl group, a methoxy group, an ethoxy group, a phenyl group, a naphthyl group, and/or an anthryl group. $L_{11}$ may be a phenylene group. b may be 0 or 1.

For example, in Formula 42, $R_{13}$ may be represented by one of Formulae 101A to 101D.

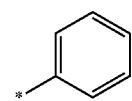

Formula 101A

-continued

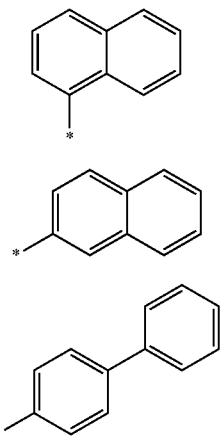

Formula 101B

Formula 101C

Formula 101D

For example, in Formula 42, $L_{11}$ may be a phenylene group and b may be 1. For example, in Formula 42, $R_{10}$ may be represented by one of Formulae 102A to 102G.

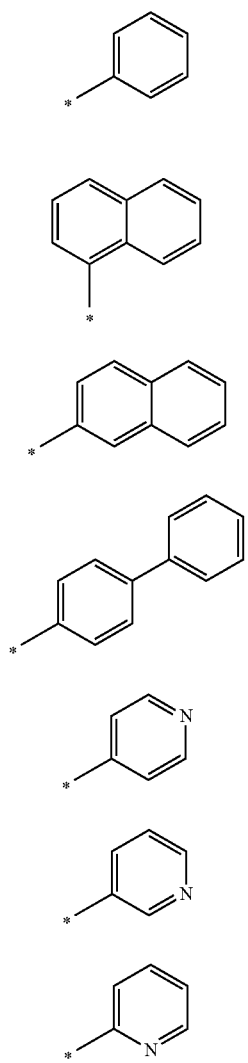

Formula 102A

Formula 102B

Formula 102C

Formula 102D

Formula 102E

Formula 102F

Formula 102G

For example, in Formula 42, $R_{28}$ and $R_{29}$ may each independently be a methyl group or a phenyl group. For example, in Formula 42, $R_{11}$, $R_{12}$, $R_{14}$ to $R_{18}$ and $R_{21}$ to $R_{27}$ may be a hydrogen atom.

For example, in Formula 41, $R_1$, $R_2$, and $R_3$ may each independently be a $C_1$-$C_{10}$ alkyl group; a $C_1$-$C_{10}$ alkoxy group; a phenyl group; a naphthyl group; a carbazolyl group; a fluorenyl group; a pyrenyl group; an anthryl group; a pyrazolyl group; a pyridinyl group; a $C_1$-$C_{10}$ alkyl group, a $C_1$-$C_{10}$ alkoxy group, a phenyl group, a naphthyl group, a carbazolyl group, a fluorenyl group, a pyrenyl group, an anthryl group, a pyrazolyl group or a pyridinyl group substituted with at least one of a halogen atom, a cyano group, a hydroxyl group, a $C_1$-$C_{10}$ alkyl group, a $C_1$-C10 alkoxy group, a phenyl group, a cyanophenyl group, a diphenylamino group, a naphthyl group, a carbazolyl group, a fluorenyl group, a $C_1$-$C_{10}$ alkyfluorenyl group, a di($C_1$-$C_{10}$ alky)fluorenyl group, a phenylfluorenyl group, a di(phenyl)fluorenyl group, and an anthryl group; or —N(Q2)(Q3). In this regard, each of Q2 and Q3 may each independently be a $C_1$-$C_{10}$ alkyl group; a $C_1$-$C_{10}$ alkoxy group; a phenyl group; a naphthyl group; a carbazolyl group; a fluorenyl group; a pyrenyl group; an anthryl group; a pyrazolyl group; a pyridinyl group; or a $C_1$-$C_{10}$ alkyl group, a $C_1$-$C_{10}$ alkoxy group, a phenyl group, a naphthyl group, a carbazolyl group, a fluorenyl group, a pyrenyl group, an anthryl group, a pyrazolyl group or a pyridinyl group substituted with at least one of a halogen atom, a cyano group, a hydroxyl group, a $C_1$-$C_{10}$ alkyl group, a $C_1$-$C_{10}$ alkoxy group, a phenyl group, a cyanophenyl group, a diphenylamino group, a naphthyl group, a carbazolyl group, a fluorenyl group, a $C_1$-$C_{10}$ alkyfluorenyl group, a di($C_1$-$C_{10}$ alky)fluorenyl group, a phenylfluorenyl group, a di(phenyl)fluorenyl group, and an anthryl group.

For example, in Formula 41, $R_1$, $R_2$, and $R_3$ may each independently be one of Formulae 201 to 226 as follows:

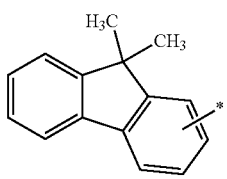

Formula 201

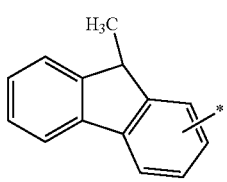

Formula 202

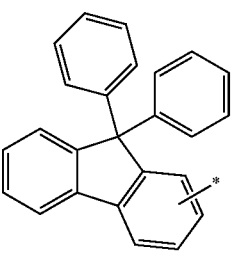

Formula 203

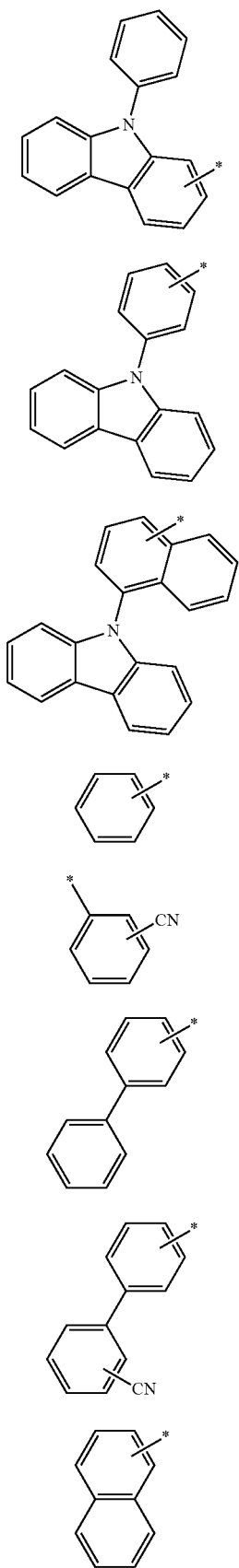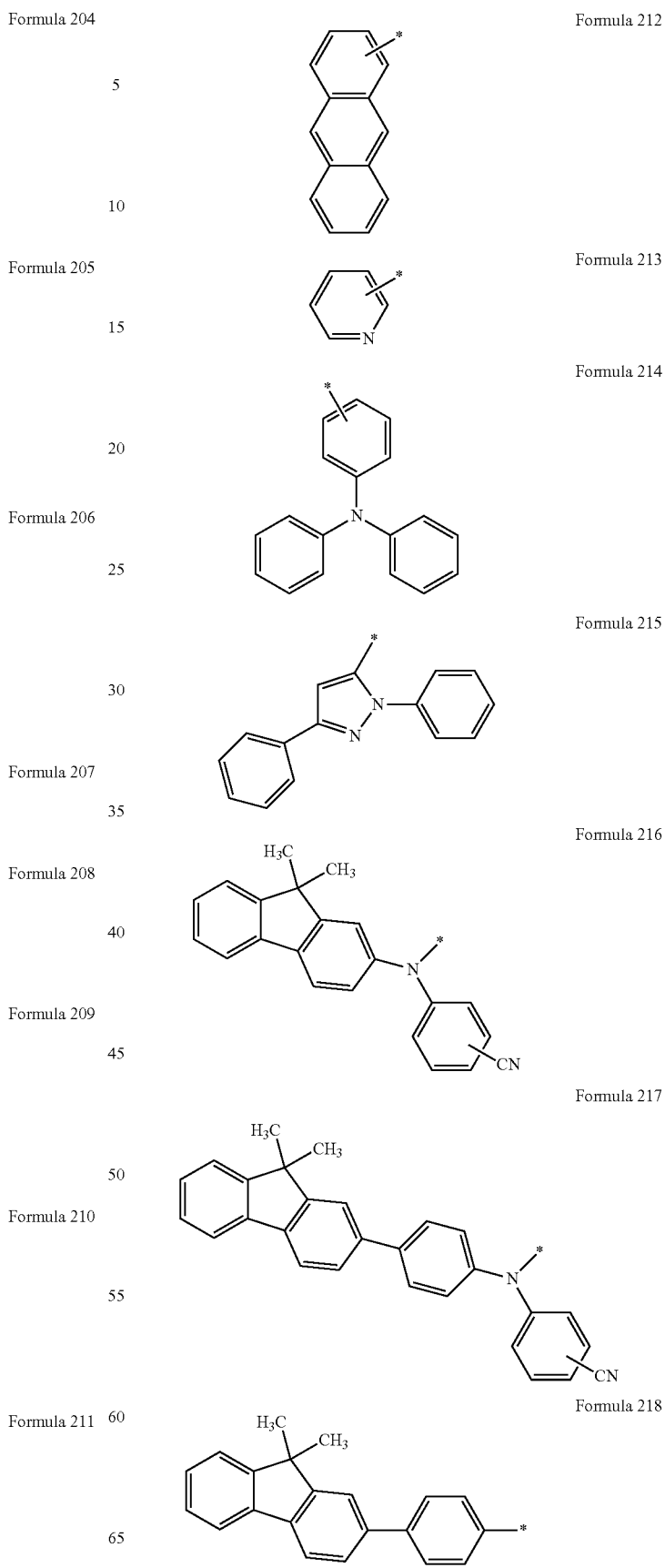

Formula 219
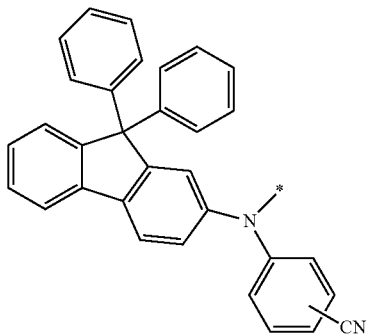
Formula 220
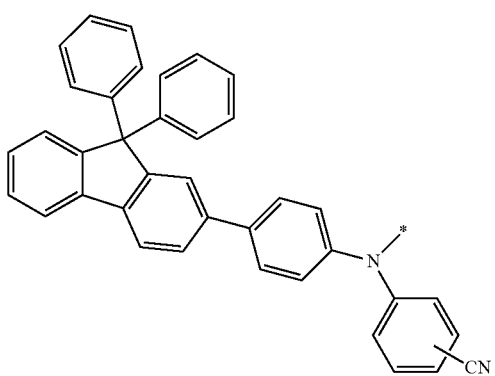
Formula 221
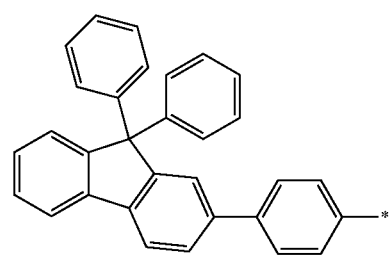
Formula 222
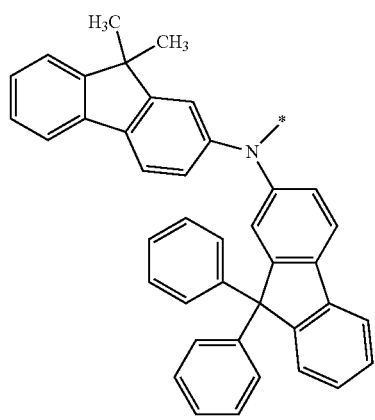
Formula 223
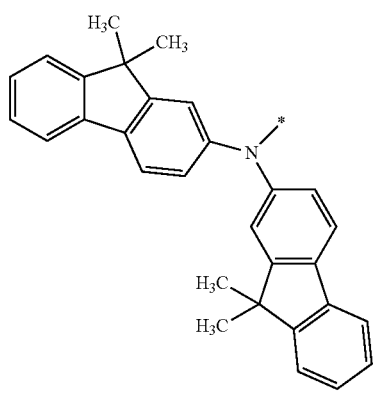
Formula 224
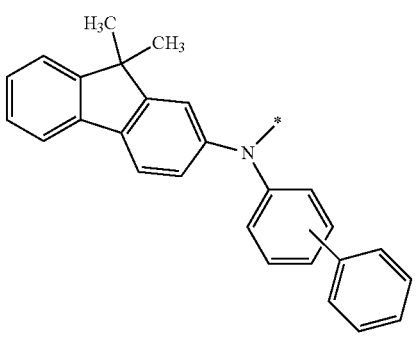
Formula 225
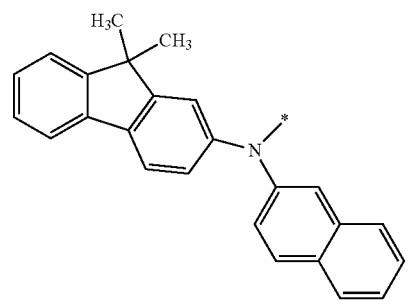
Formula 226
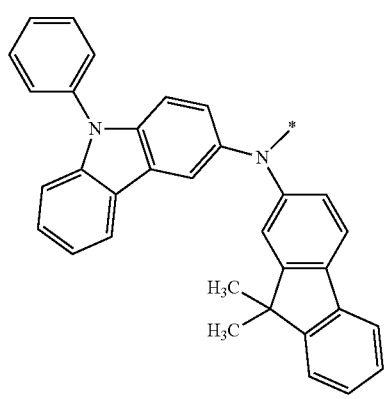
In an embodiment, the HTL may include at least one compound of the compounds represented by Formulae 1 through 38 below, but is not limited thereto:

1
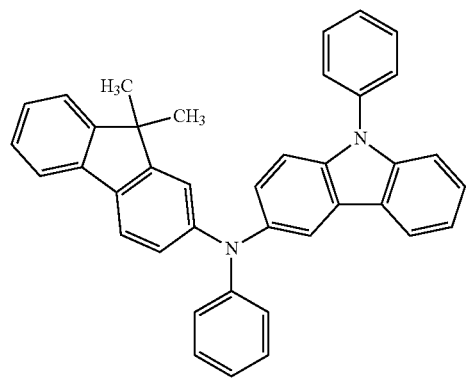
2
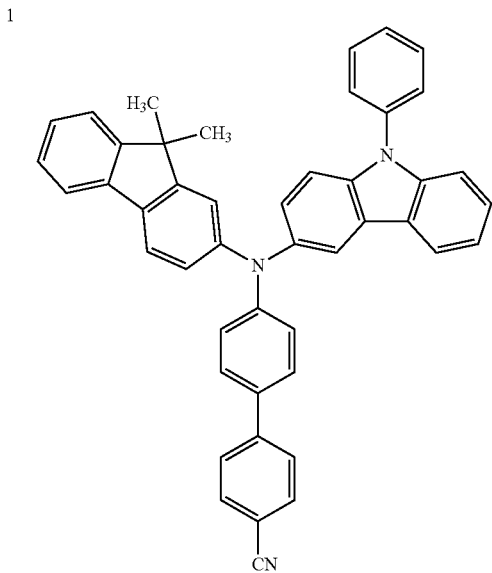
3
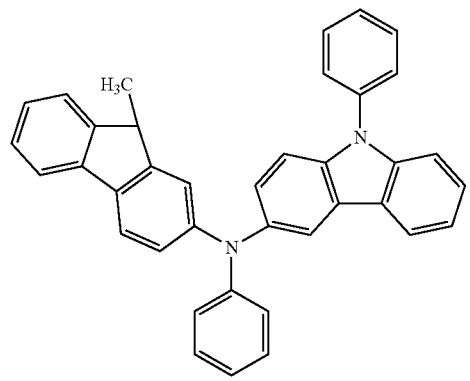
4
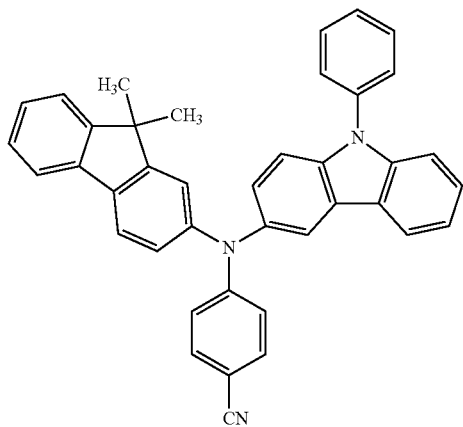
5
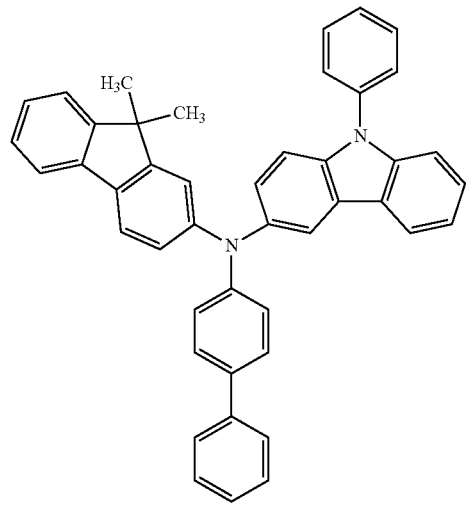
6
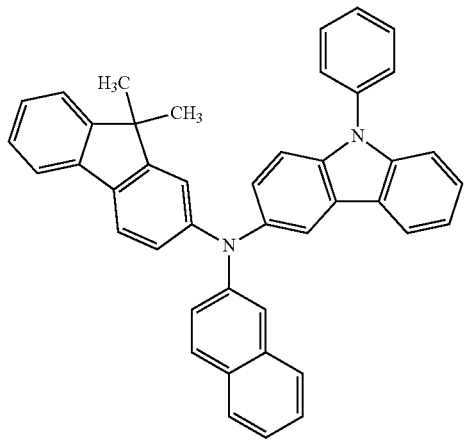

-continued
7
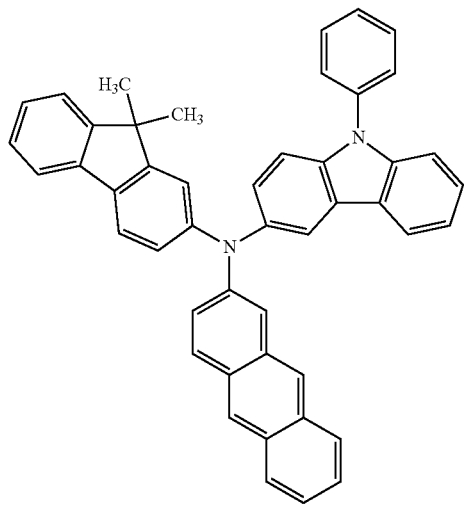
8
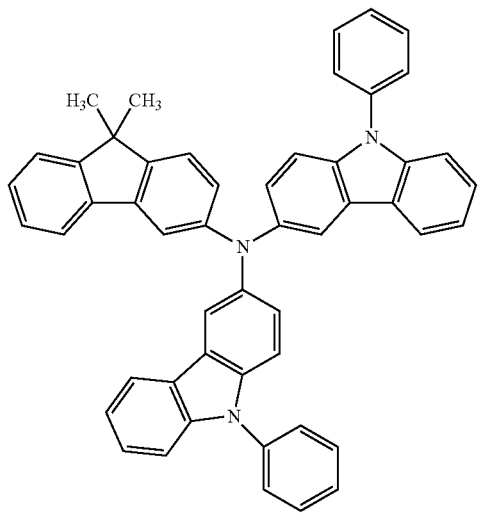
9
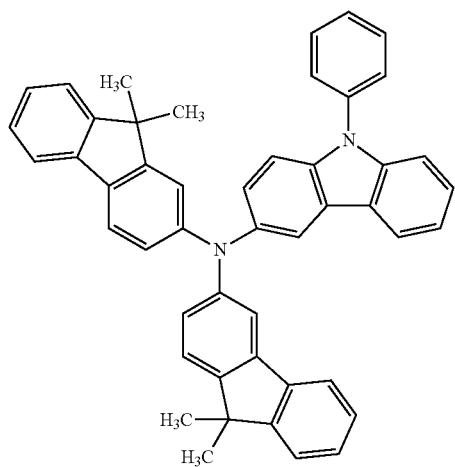
10
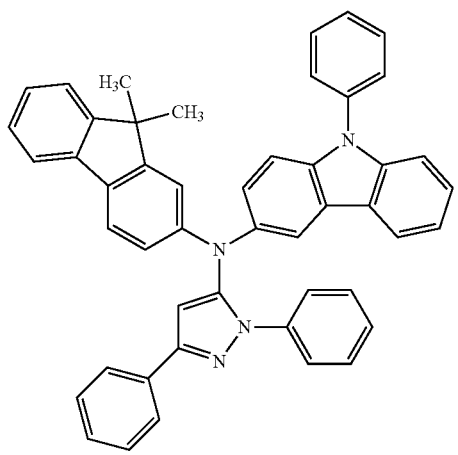
11
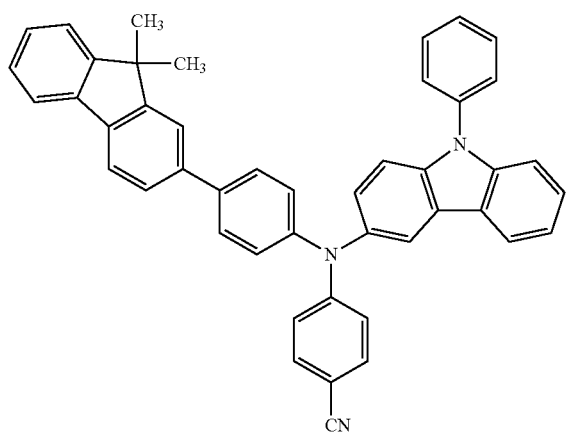
12
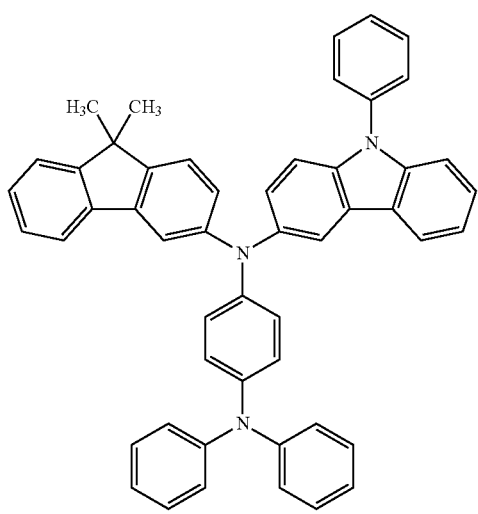

-continued
13
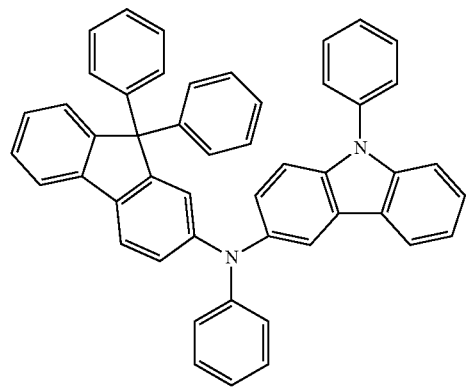
14
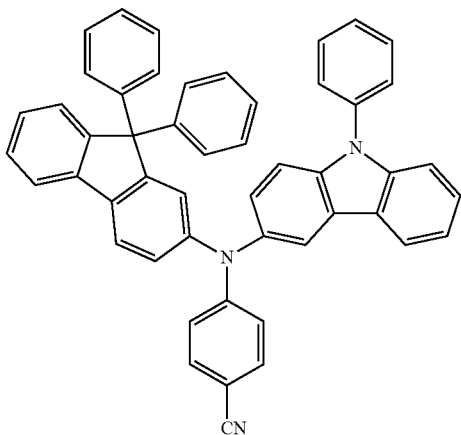
15
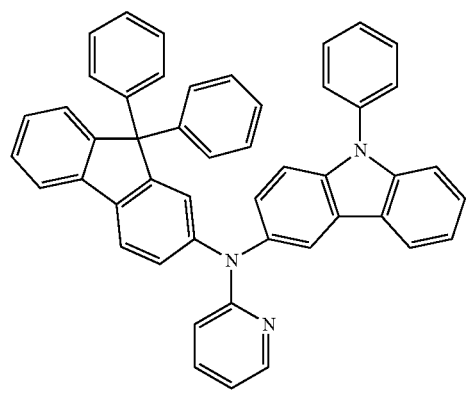
16
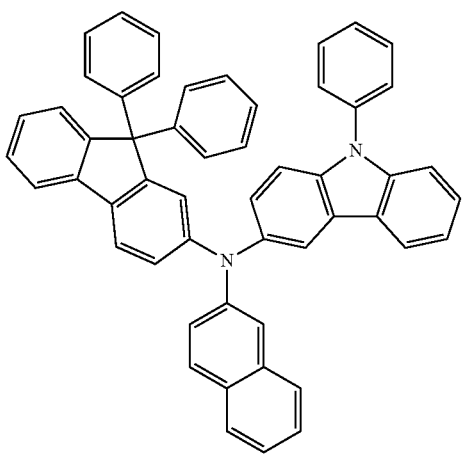
17
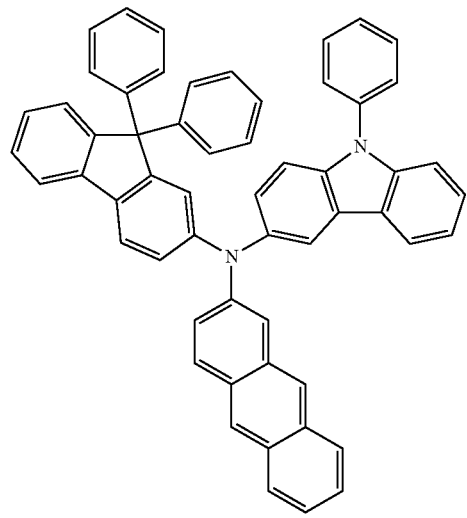
18
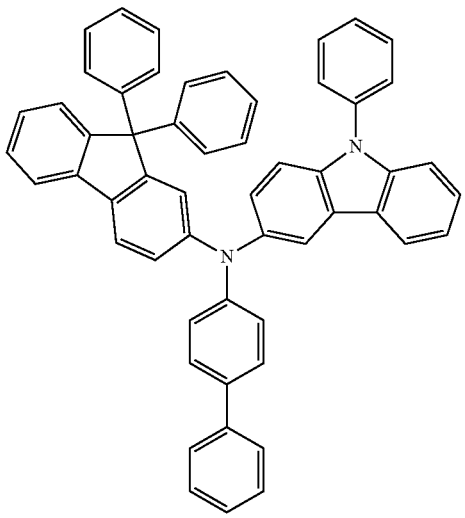

-continued
19
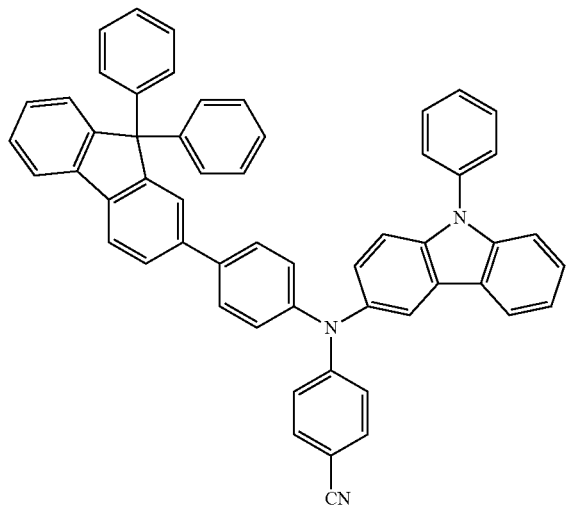
20
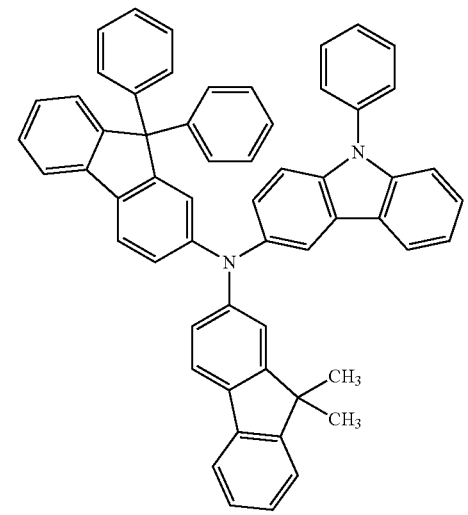
21
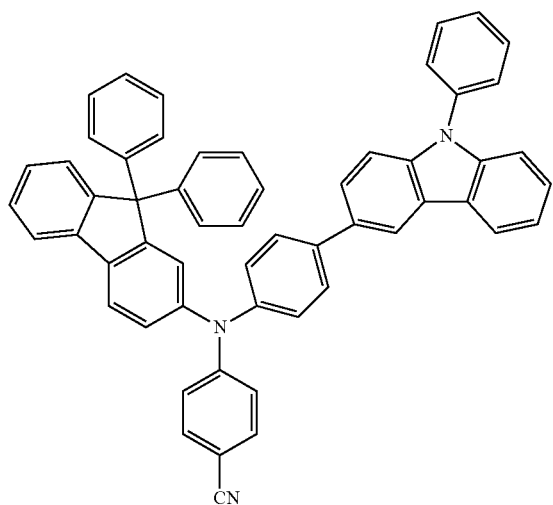
22
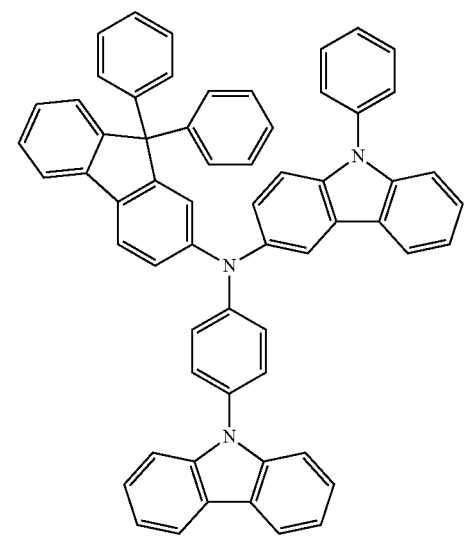
23
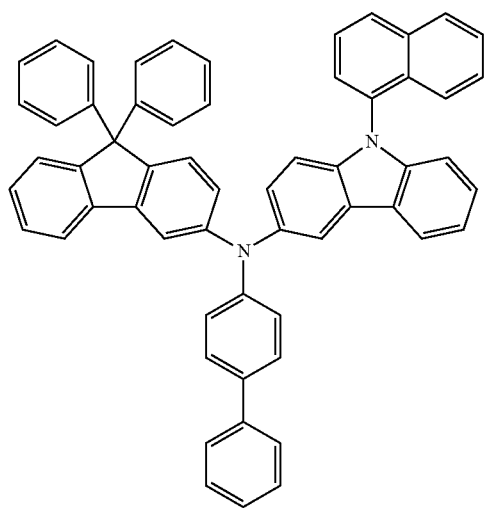
24
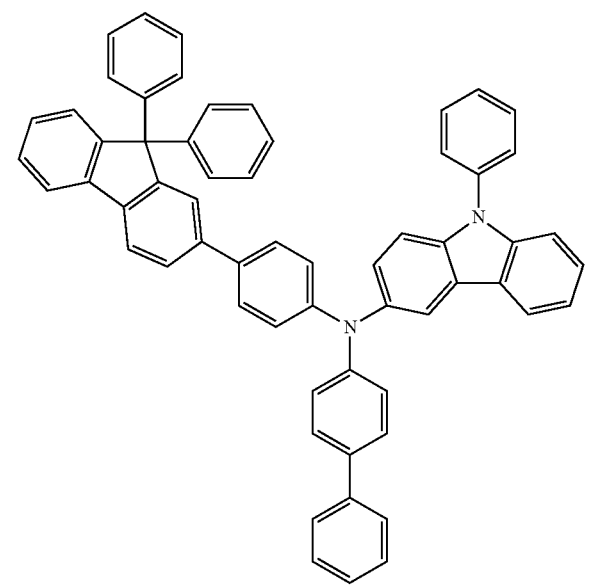

-continued
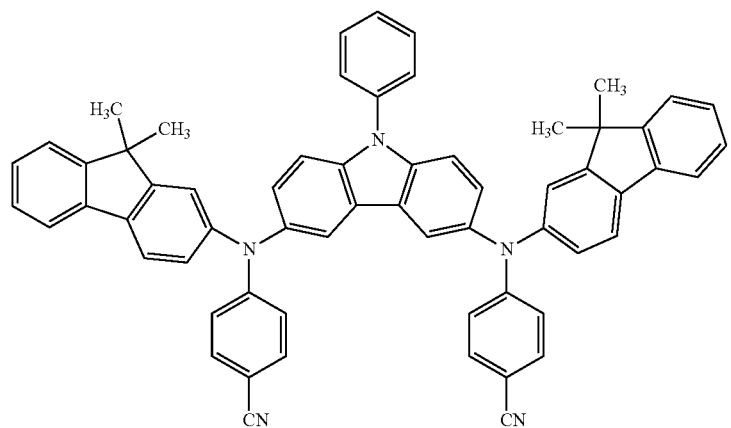
25
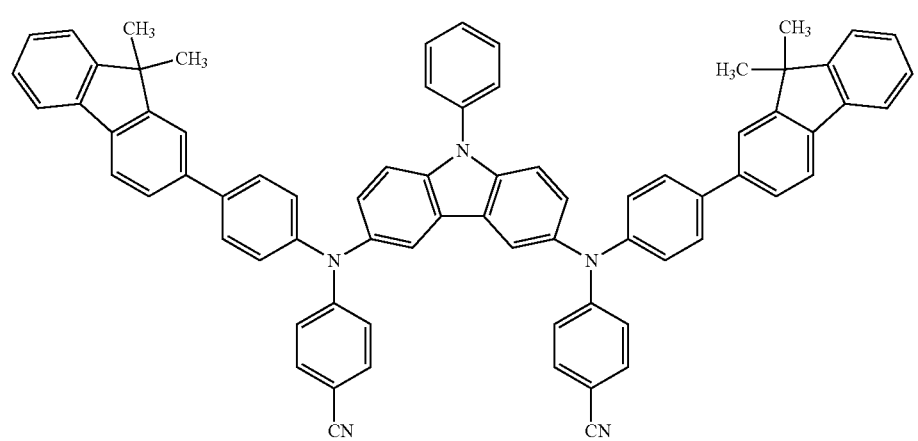
26
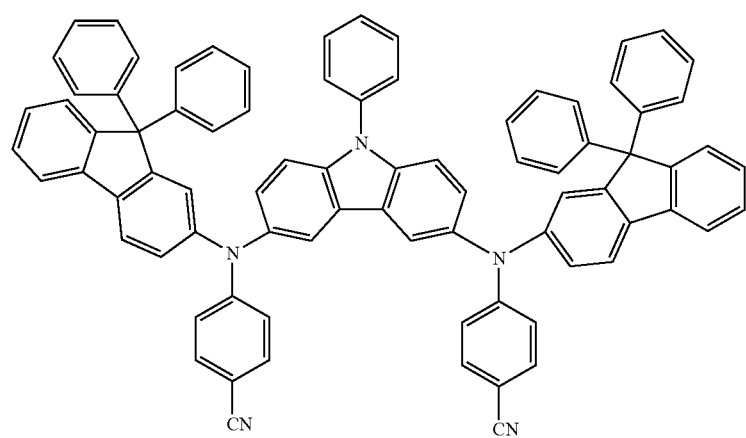
27

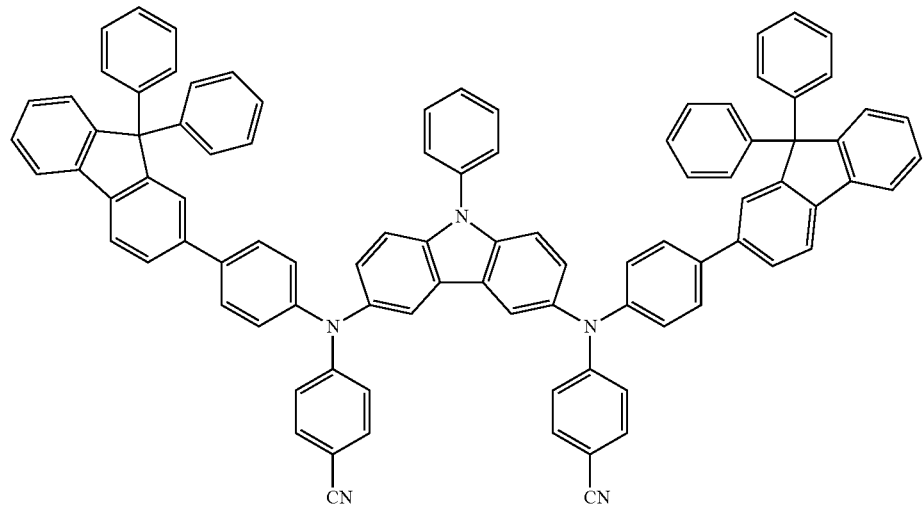
28
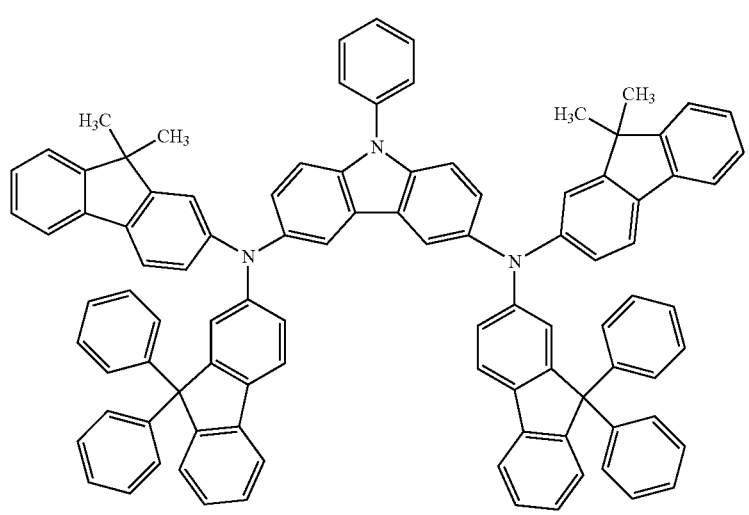
29
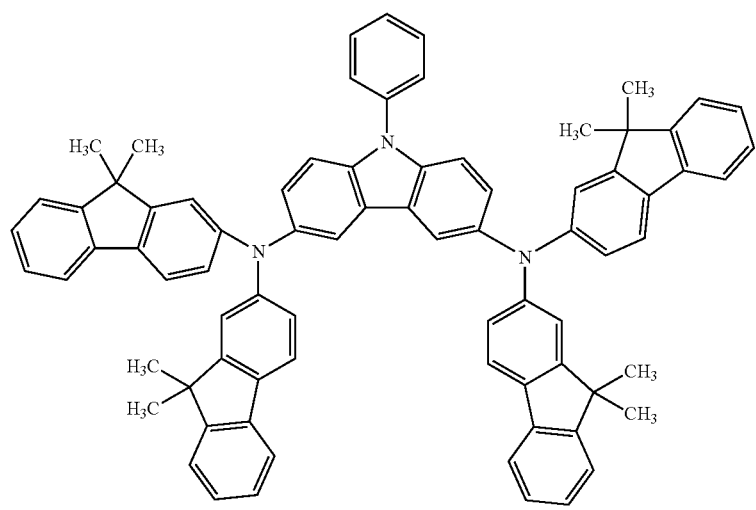
30

-continued
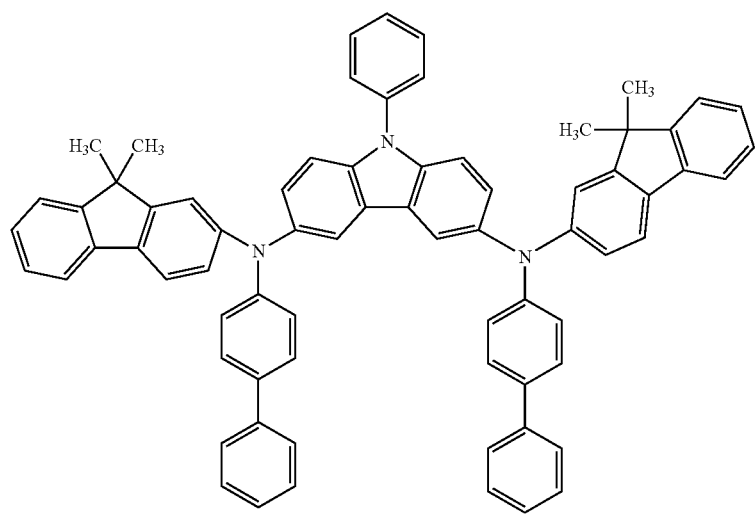
31
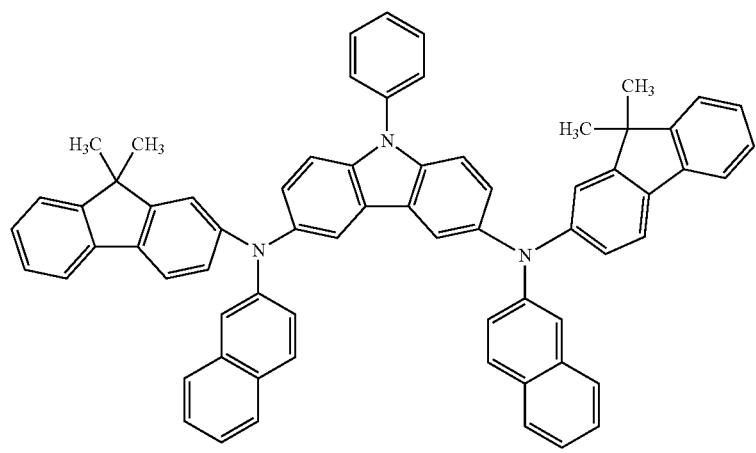
32
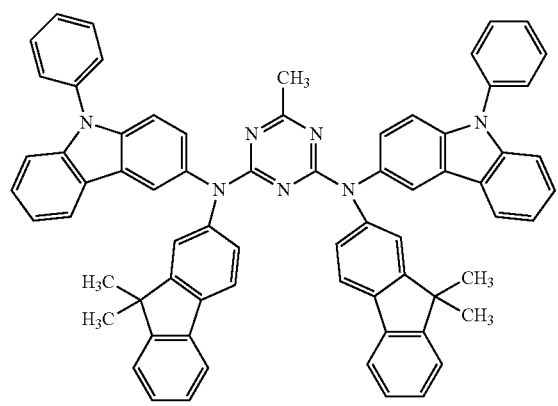
33
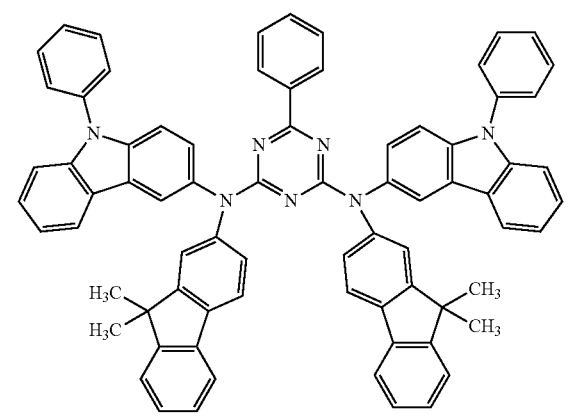
34

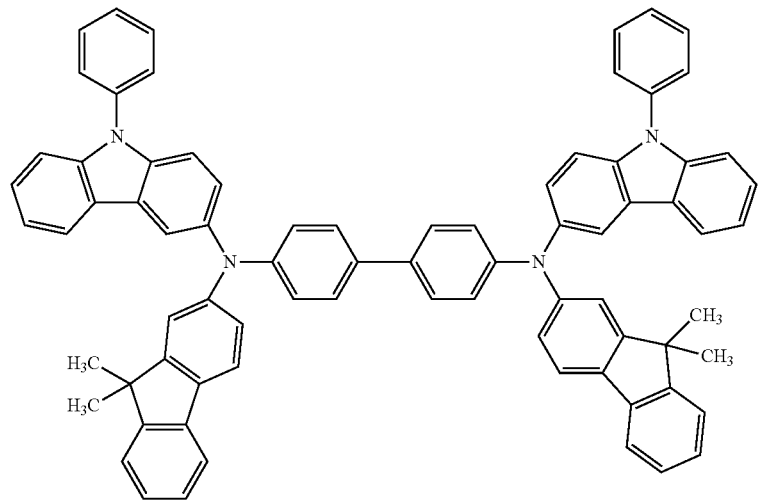
35
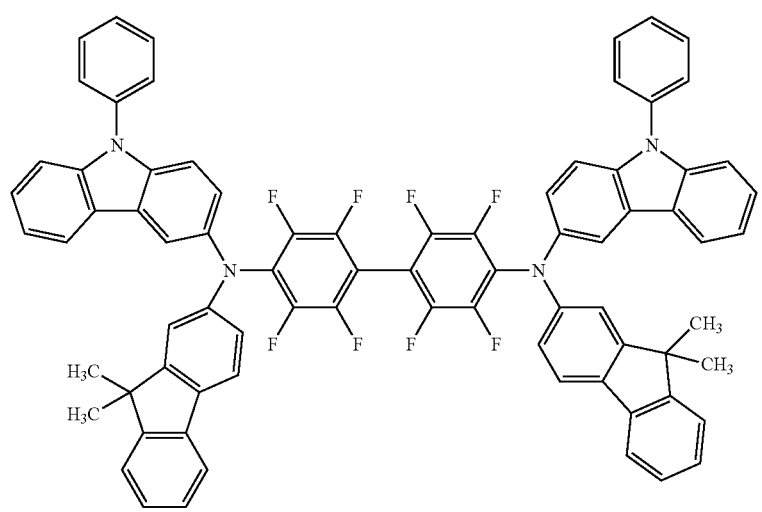
36
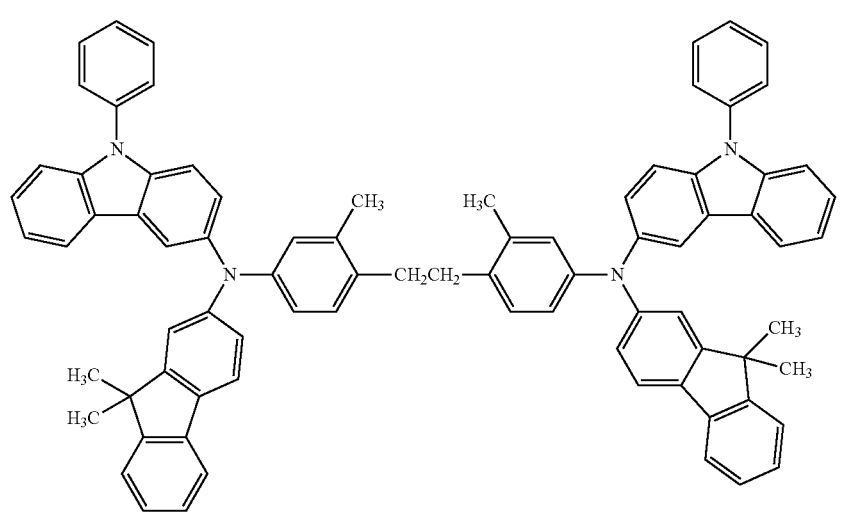
37

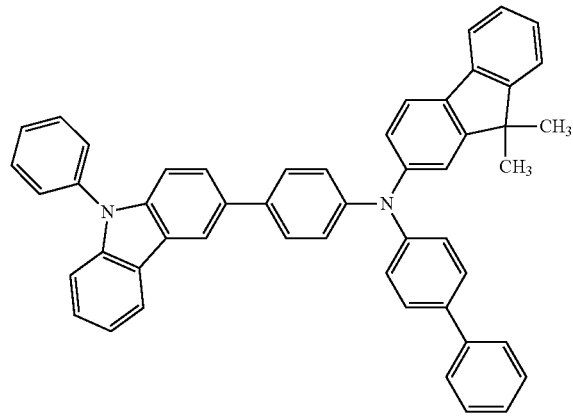

The HTL may have a thickness of about 50 Å to about 10,000 Å, e.g., a thickness of 100 Å to about 2,500 Å. Maintaining the thickness of the HTL at about 50 Å to about 10,000 Å may help ensure that the HTL has a satisfactory hole transporting ability without a substantial increase in driving voltage.

Then, an EML may be formed on the HTL by using, e.g., vacuum deposition, spin coating, casting, LB deposition, or the like. When the EML is formed using vacuum deposition or spin coating, the conditions for deposition and coating may be similar to those for the formation of the HIL, although the conditions for deposition and coating may vary according to the material that is used to form the EML.

The EML may include a compound or a combination of a host and a dopant. The host may include, e.g., Alq3, 4,4'-N, N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), E3, and distyrylarylene (DSA), but are not limited thereto.

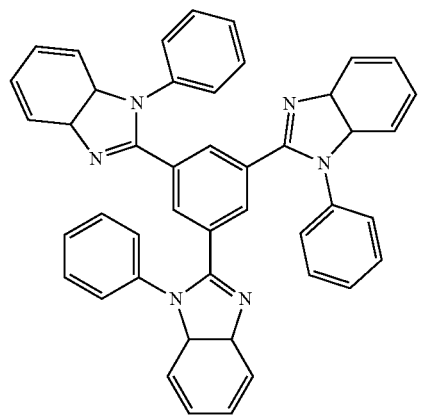

TPBI

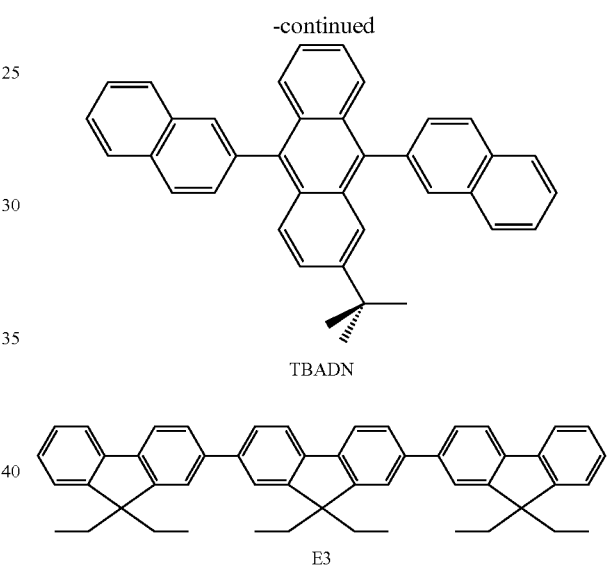

Examples of red dopants may include PtOEP, Ir(piq)$_3$, and Btp$_2$Ir(acac), but are not limited thereto.

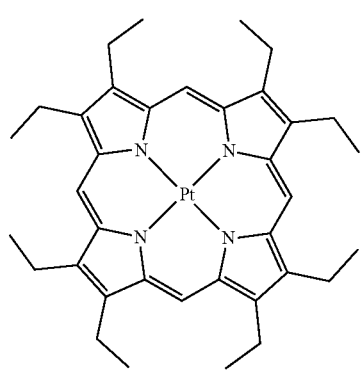

PtOEP

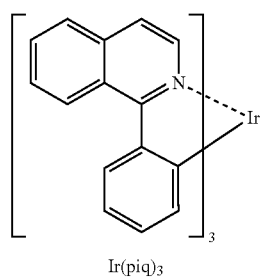

Ir(piq)₃

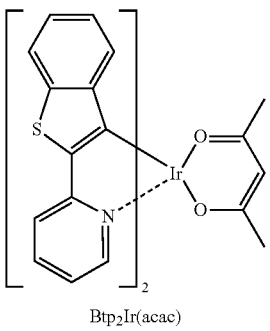

Btp₂Ir(acac)

Examples of green dopants may include Ir(ppy)₃ (ppy=phenylpyridine), Ir(ppy)₂(acac), and Ir(mpyp)₃, but are not limited thereto.

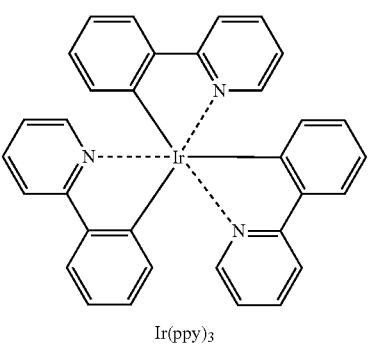

Ir(ppy)₃

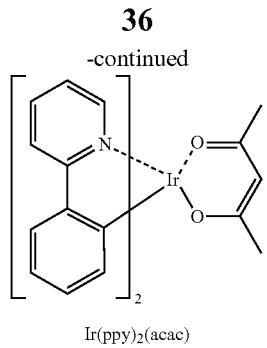

Ir(ppy)₂(acac)

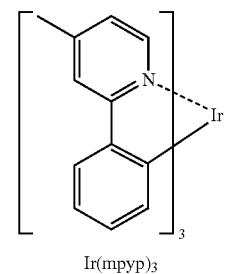

Ir(mpyp)₃

Examples of blue dopants may include F₂Irpic, (F₂ppy)₂Ir(tmd), Ir(dfppz)₃, ter-fluorene, 4,4'-bis(4-diphenyl aminostyryl)biphenyl (DPAVBi), 2,5,8,11-tetra-tert-butyl perylene (TBPe), and compounds represented by Formulae 51, 54, 81, and 83, but are not limited thereto.

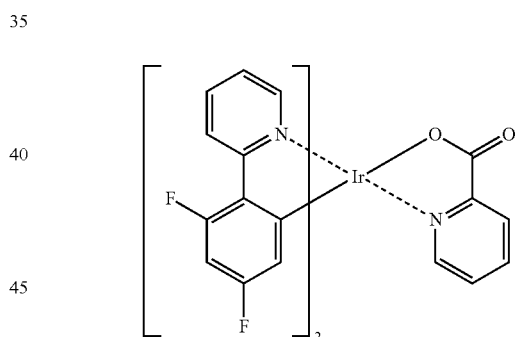

F₂Irpic

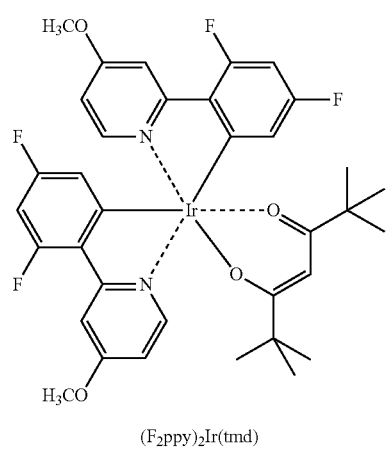

(F₂ppy)₂Ir(tmd)

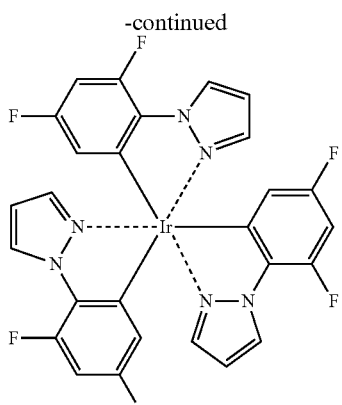

Ir(dfppz)₃

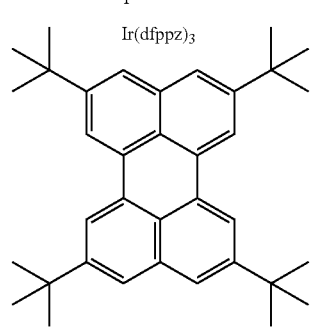

TBPe

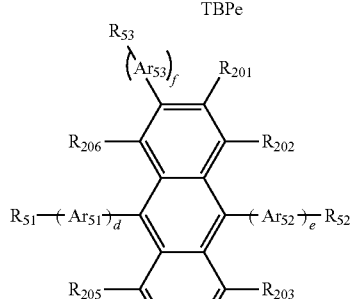

Formula 51

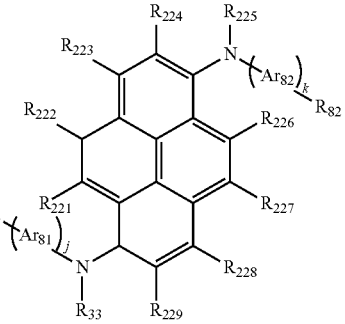

Formula 83

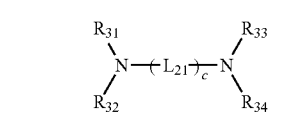

Formula 54

Formula 81

In Formulae 51 through 54 above, Ar$_{51}$, A$_{52}$, Ar$_{53}$ and Ar$_{54}$ may be defined as described above in connection with Ar$_1$.

In Formulae 51 through 54, Ar$_{51}$, A$_{52}$, Ar$_{53}$ and Ar$_{54}$ may each independently be, e.g., a phenylene group, a naphthylene group, an anthrylene group, and a phenyl-substituted anthrylene group, but are not limited thereto.

In Formulae 51 through 54, R$_{201}$ through R$_{209}$ and R$_{51}$ through R$_{56}$ may be defined as described above in connection with Ar$_2$. For example, R$_{201}$ through R$_{209}$ may be hydrogen.

In Formulae 51 through 54, d, e, f and g may each independently be an integer from 0 to 10. For example, d, e, f and g may each independently be 0, 1, or 2, but are not limited thereto.

In Formulae 51 through 54, R$_{51}$ through R$_{56}$ may each independently be, e.g., hydrogen, a methyl group, an ethyl group, a propyl group, a butyl group, a phenyl group, a naphthyl group, an anthryl group, a pyrenyl group, a carbazolyl group, and —N(Q$_2$)(Q$_3$), wherein Q$_2$ and Q$_3$ are each independently a methyl group, a phenyl group, a naphthyl group, and/or an anthryl group.

In Formula 81, L$_{21}$ may be, e.g., a substituted or unsubstituted C$_1$-C$_{30}$ alkylene group, a substituted or unsubstituted C$_2$-C$_{30}$ alkenylene group, a substituted or unsubstituted C$_5$-C$_{30}$ arylene group and a substituted or unsubstituted C$_4$-C$_{30}$ heteroarylene group. c may be an integer from 1 to 20 and c groups of L$_{21}$ in -(L$_{21}$)$_c$- may be identical to or different from each other. R$_{31}$ through R$_{34}$ may each independently be a substituted or unsubstituted C$_1$-C$_{30}$ alkyl group, a substituted or unsubstituted C$_2$-C$_{30}$ alkenyl group, a substituted or unsubstituted C$_2$-C$_{30}$ alkynyl group, a substituted or unsubstituted C$_1$-C$_{30}$ alkoxy group, a substituted or unsubstituted C$_5$-C$_{30}$ aryl group, and/or a substituted or unsubstituted C$_4$-C$_{30}$ heteroaryl group.

In Formula 81, L$_{21}$ may be defined as described above in connection with Ar$_1$ (the description of —N(Q$_1$)- is excluded) and R$_{31}$ through R$_{34}$ may be defined as described above in connection with Q$_1$ (the description of —N(Q$_2$)(Q$_3$) is excluded).

In Formula 81, L$_{21}$ may be an ethenylene group, a propenylene group, or a phenylene group.

In Formula 81, c may be 1, 2, 3, 4, 5, or 6.

In Formula 81, R$_{31}$ through R$_{34}$ may each independently be hydrogen, a methyl group, an ethyl group, a propyl group, a butyl group, a methoxy group, an ethoxy group, a propoxy group, a butoxy group, a phenyl group, a naphthyl group, and/or an anthryl group.

In Formula 81, c groups of L$_{21}$ in -(L$_{21}$)$_c$- may be identical to or different from each other. For example, when c is 2, the two groups of L$_{21}$ may be both phenylene groups, or one of the two may be a phenylene group and the other may be an ethenylene group.

The compound of Formula 81 may be Compound 40 below, but is not limited thereto:

Compound 40

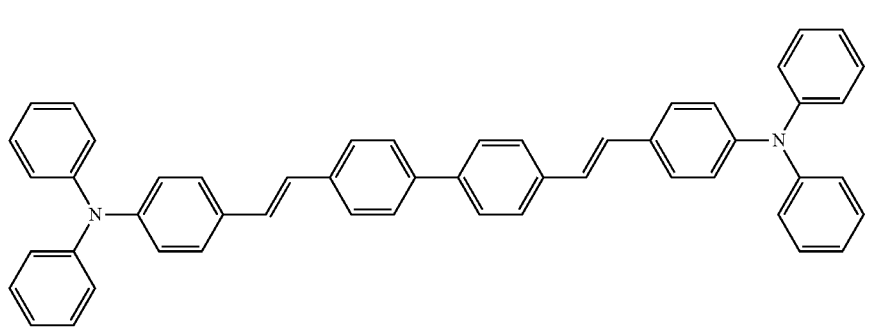

In Formula 83, $Ar_{81}$ and $Ar_{82}$ may be defined as described above in connection with $Ar_1$.

In Formula 83, $Ar_{81}$ and $Ar_{82}$ may each independently be a phenylene group, a phenyl-substituted phenylene group, a naphthylene group, an anthrylene group, a phenyl-substituted anthrylene group, and/or $—N(Q_1)-$, but are not limited thereto. In this regard, $Q_1$ may be a phenyl group or a phenyl group substituted with at least one —F group.

In Formula 83, $R_{221}$ through $R_{229}$ and $R_{81}$ through $R_{84}$ may be defined as described above in connection with $Ar_2$. For example, $R_{221}$ through $R_{229}$ may be hydrogen.

In Formula 83, j and k may be each independently an integer from 0 to 10. In an implementation, j and k may each independently be 0, 1, or 2.

In Formula 83, $R_{81}$ through $R_{84}$ may each independently be hydrogen, a halogen atom, a methyl group, an ethyl group, a propyl group, a butyl group, a phenyl group, a naphthyl group, an anthryl group, pyrenyl group, a carbazolyl group, and $—N(Q_2)(Q_3)$, wherein $Q_2$ and $Q_3$ are each independently a methyl group, a phenyl group, a naphthyl group, and/or an anthryl group.

In an embodiment, the EML of the organic layer 7 may include, e.g., Compound 40 above, Compounds 43, 51 through 55, and 58 below, as a host, but is not limited thereto.

Compound 43

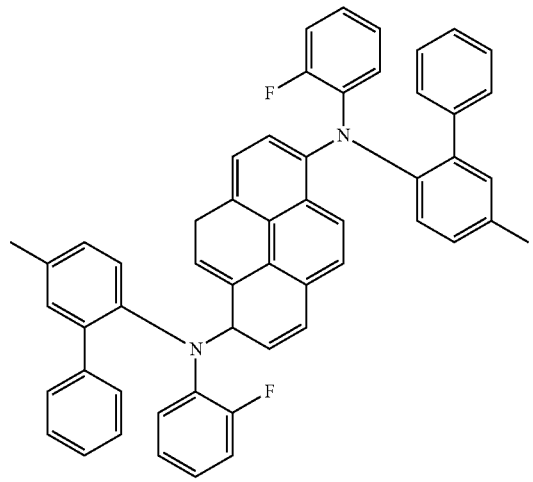

-continued

Compound 51

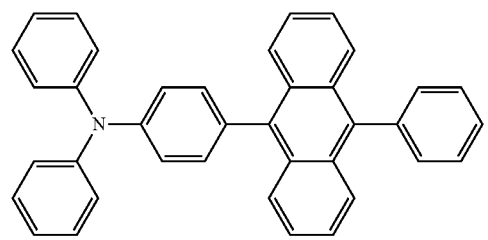

Compound 52

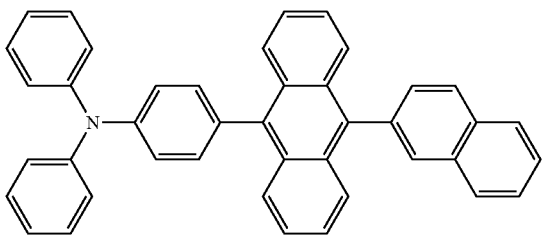

Compound 53

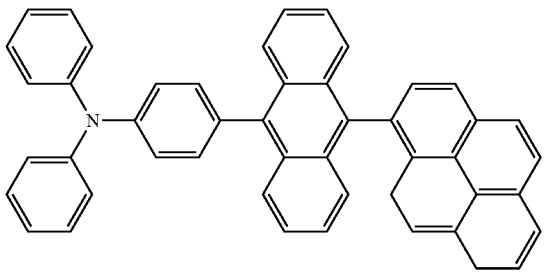

Compound 54

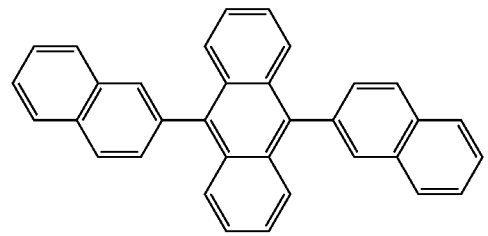

Compound 55

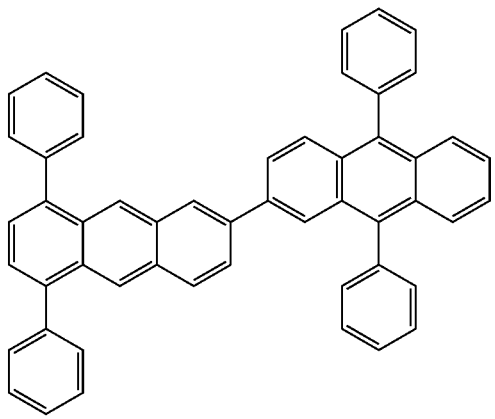

Compound 58

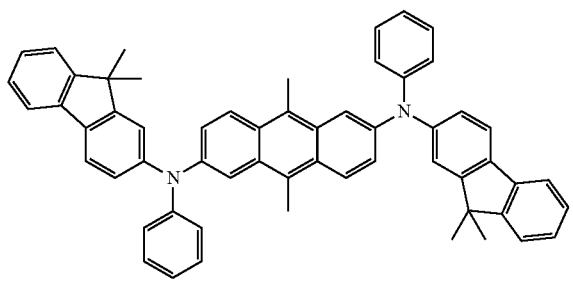

When a dopant and a host are used together as materials for the EML, the dopant may be included in an amount of about 0.01 to about 15 parts by weight, based on 100 parts by weight of the host, but is not limited thereto.

The EML may have a thickness of about 100 Å to about 1,000 Å, e.g., about 200 Å to about 600 Å. Maintaining the thickness of the EML at about 100 Å to about 1,000 Å may help ensure that the EML has excellent emitting ability without a substantial increase in driving voltage.

In an embodiment, the organic layer 7 may include a HTL and an EML, wherein the HTL includes a compound represented by Formula 2 above and the EML includes the compound represented by Formula 3 above (as a dopant) and a host such as those described above. In this regard, since the compound of Formula 3 is a blue dopant, the OLED may emit blue light having high color purity with high efficiency and low power consumption.

In an embodiment, the organic layer 7 may include a HTL and an EML, wherein the HTL includes one compound represented by Formulae 1 through 37 above and the EML includes Compound 40 and a host such as those described above.

When a phosphorescent dopant is also used to form the EML, a HBL may be formed between the HTL and the EML by using, e.g., vacuum deposition, spin coating, casting, LB deposition, or the like, in order to prevent diffusion of triplet excitons or holes into an ETL. When the HBL is formed using vacuum deposition or spin coating, the conditions for deposition and coating may be similar to those for the formation of the HIL, although the conditions for deposition and coating may vary according to the material that is used to form the HBL. Any material that is commonly used to form a HBL may be used. Examples of materials for forming the HBL may include an oxadiazole derivative, a triazole derivative, and a phenanthroline derivative, but are not limited thereto.

The HBL may have a thickness of about 50 Å to about 1,000 Å, e.g., about 100 Å to about 400 Å. Maintaining the thickness of the HBL at about 50 Å to about 1,000 Å may help ensure that the HBL has an excellent hole blocking ability without a substantial increase in driving voltage.

Then, an ETL may be formed on the HBL or EML by, e.g., vacuum deposition, spin coating, casting, or the like. When the ETL is formed using vacuum deposition or spin coating, the deposition and coating conditions may be similar to those for formation of the HIL, although the deposition and coating conditions may vary according to a compound that is used to form the ETL. A material for forming the ETL may be any suitable material that can stably transport electrons injected from an electron injecting electrode (cathode). Examples of materials for forming the ETL may include a quinoline derivative, such as tris(8-quinolinorate)aluminum ($Alq_3$), TAZ, and Balq, but are not limited thereto.

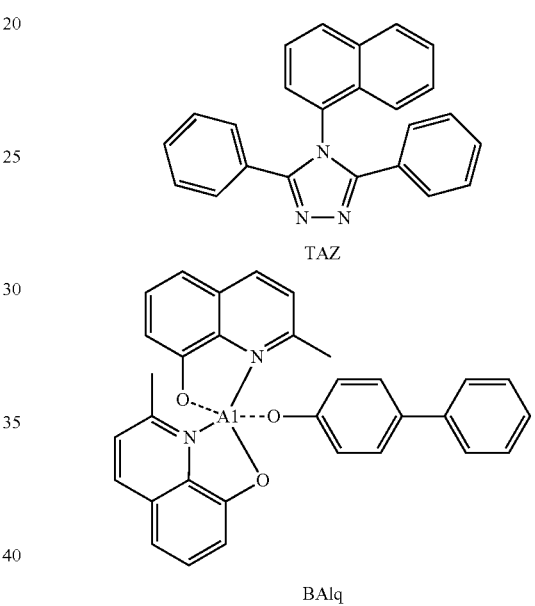

TAZ

BAlq

The ETL may have a thickness of about 100 Å to about 1,000 Å, e.g., about 150 Å to about 500 Å. Maintaining the thickness of the ETL at about 100 Å to about 1,000 Å may help ensure that the ETL has satisfactory electron transporting ability without a substantial increase in driving voltage.

Then, an EIL may be formed on the ETL. The EIL may be formed of any suitable material allowing electrons to be easily injected from the cathode.

Examples of materials for forming the EIL may include LiF, NaCl, CsF, $Li_2O$, and BaO. Deposition and coating conditions for forming the EIL may be similar to those for formation of the HIL, although the deposition and coating conditions may vary according to a material that is used to form the EIL.

The EIL may have a thickness of about 1 Å to 100 Å, e.g., about 5 Å to about 90 Å. Maintaining the thickness of the EIL at about 1 Å to 100 Å may help ensure that the EIL has satisfactory electron injection ability without a substantial increase in driving voltage.

Finally, the second electrode 9 may be formed on the organic layer 7. The second electrode 9 may be a cathode, which is an electron injecting electrode. A metal for forming the second electrode 9 may be a metal, an alloy, an electrically conductive compound, which have a low-work function, or a mixture thereof. In this regard, the second electrode 9 may be formed of, e.g., lithium (Li), magnesium (Mg), aluminum (Al), aluminum (Al)-lithium (Li), calcium (Ca), magnesium (Mg)-indium (In), or magnesium (Mg)-silver (Ag).

Figure 4:
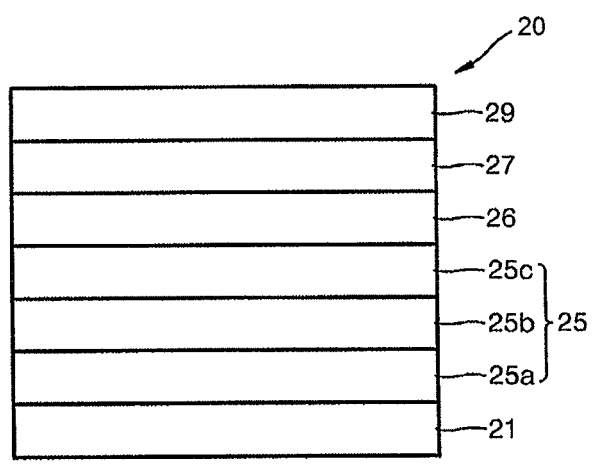
FIG. 4 illustrates a cross-sectional view of a structure of an OLED according to another embodiment.

FIG. 4 illustrates a schematic sectional view of an OLED 20 according to another embodiment. Referring to FIG. 4, the OLED 20 according to the present embodiment may include a substrate 21, a first electrode 25, a carbonaceous material-containing layer 26, an organic layer 27, and a second electrode 29. The first electrode 25 may include an Al-based reflective layer 25a including nickel (Ni) and a first element, a transparent conductive layer 25b, and a second element-containing zinc oxide layer 25c, which are disposed in this order on the substrate 21. The substrate 21, the carbonaceous material-containing layer 26, the organic layer 27, the second electrode 29, the Al-based reflective layer 25a including Ni and the first element, and the transparent conductive layer 25b may be the same as described above with reference to FIG. 1, and thus repeated detailed descriptions thereof are omitted.

Referring to FIG. 4, in the OLED 20 according to the current embodiment, the first electrode 25 may further include the second element-containing zinc oxide layer 25c, in contrast to the OLED 10 in FIG. 1. The second element-containing zinc oxide layer 25c may lower a hole injection barrier by increasing the work function of the first electrode 25. Thus, holes may be easily injected into the organic layer 27 from the first electrode 25.

The second element in the second element-containing zinc oxide layer 25c may include at least one of aluminum (Al), indium (In), gallium (Ga), germanium (Ge), gadolinium (Gd), zirconium (Zr), molybdenum (Mo), and nickel (Ni). For example, the second element may include aluminum (Al). In an implementation, the second element may be aluminum (Al), but is not limited thereto.

The second element may be included in the second element-containing zinc oxide layer 25c in an amount of about 0.5 to about 10 parts by weight, based on 100 parts by weight of the second element-containing zinc oxide layer 25c. Maintaining the amount of the second element in the second element-containing zinc oxide layer 25c at about 0.5 to about 10 parts by weight may help ensure that the second element-containing zinc oxide layer 25c has excellent hole transporting ability without a substantial increase in electrical resistance or a substantial reduction in transmittance of visible light. In an implementation, the second element may be included in an amount of about 0.5 to about 5 parts by weight, based on 100 parts by weight of the second element-containing zinc oxide layer 25c, but is not limited thereto.

The second element-containing zinc oxide layer 25c may have a thickness of about 1 Å to about 800 Å, e.g., about 10 Å to 500 Å. Maintaining the thickness of the second element-containing zinc oxide layer 25c at about 1 Å to about 800 Å may help ensure that excellent efficiency and power consumption characteristics are attained with a substantial reduction in driving voltage.

The OLEDs 10 and 20 according to the embodiments are illustrated in FIGS. 1 and 6. However, the embodiments are not limited thereto. For example, any of the OLEDs 10 and 20 may further include a metal layer between the Al-based reflective layer 5a (25a) and the substrate 1 (21). The metal layer may function as a barrier layer that blocks diffusion of Al from the Al-based reflective layer 5a (25a) into the substrate 1 (21). The metal layer may include at least one of molybdenum (Mo), tungsten (W), titanium (Ti), palladium (Pd), platinum (Pt), and gold (Au), but is not limited thereto. In an implementation, the metal layer may include a titanium (Ti) layer. The metal layer may have a thickness of about 20 nm to about 200 nm, e.g., about 50 nm to about 100 nm. Maintaining the thickness of the metal layer at about 20 nm to about 200 nm may help ensure that diffusion of aluminum (Al) is effectively prevented. However, the thickness of the metal layer is not limited thereto.

Hereinafter, one or more embodiments will be described in detail with reference to the following examples. However, these examples are not intended to limit the purpose and scope of the one or more embodiments.

EXAMPLES

Comparative Example 1

A 15 $\Omega/cm^2$ (1200 Å) ITO glass substrate (from Corning Co.) was cut to a size of 50 mm×50 mm×0.7 mm, ultrasonically washed with isopropyl alcohol for 5 minutes and then with pure water for 5 minutes, and washed again with UV ozone for 30 minutes. Then, m-MTDATA was vacuum-deposited on the ITO layer to form a HIL having a thickness of 700 Å, and then Compound 5 above was vacuum-deposited on the HIL to form a HTL having a thickness of 700 Å. 97 wt % of 9,10-di(naphthalene-2-yl)anthracene (ADN) as a host and 3 wt % of Compound 58 above as a dopant were deposited on the HTL to form an EML having a thickness of 200 Å. Alq3 was vacuum-deposited on the EML to form an ETL having a thickness of 300 Å. Liq was vacuum-deposited on the ETL to form an EIL having a thickness of 5 Å and Mg and Al were vacuum-deposited on the EIL to form a cathode having a thickness of 160 Å. Next, Alq3 was deposited on the cathode to form a protection layer having a thickness of 600 Å, thereby completing the manufacture of an OLED.

Example 1

An OLED was manufactured in the same manner as in Comparative Example 1, except that a glass substrate on which an AlNiLa layer having a thickness of 5000 Å (containing 2 wt % of Ni and 0.3 wt % of La) and a 70 Å thick ITO layer as a transparent conductive layer were sequentially disposed in this order, was used, instead of the ITO glass substrate, and $C_{60}$ was vacuum-deposited on the ITO layer to a thickness of 3 Å to form a carbonaceous material-containing layer before the HIL was formed.

Example 2

An OLED was manufactured in the same manner as in Example 1, except that $C_{60}$ was deposited to a thickness of 5 Å.

Example 3

An OLED was manufactured in the same manner as in Example 1, except that $C_{60}$ was deposited to a thickness of 10 Å and no HIL was formed.

Example 4

An OLED was manufactured in the same manner as in Example 1, except that $C_{60}$ was deposited to a thickness of 30 Å and no HIL was formed.

Evaluation Results

Power consumption characteristics and efficiencies of the OLEDs manufactured in Comparative Example 1 and Examples 1 through 4 were measured using a PR650 (Spectroscan) Source Measurement Unit (available from PhotoResearch, Inc.). The results are shown in Table 1 below.

TABLE 1

|  | Driving voltage (V) | Power efficiency (lm/W) |
|---|---|---|
| Comparative Example 1 | 6.5 | 1.4 |
| Example 1 | 5.2 | 1.8 |
| Example 2 | 5.5 | 2.6 |
| Example 3 | 5.4 | 3.0 |
| Example 4 | 5.6 | 3.1 |

Referring to Table 1, it may be seen that the OLEDs of Examples 1 through 4 had lower driving voltages and improved power efficiencies, compared to the OLED of Comparative Example 1.

As described above, an OLED according to an embodiment may have excellent efficiency and power efficiency characteristics.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting device, comprising:
a substrate;
a first electrode on the substrate;
a second electrode;
an organic layer between the first electrode and the second electrode; and
a carbonaceous material-containing layer between the first electrode and the organic layer, the carbonaceous material being at least one of $C_{60}$, a fullerene-based compound, carbon nanotubes, carbon fiber, carbon black, graphite, carbine, $MgC_{60}$, $CaC_{60}$, and $SrC_{60}$, and the carbonaceous material-containing layer having a thickness of about 3 Å to about 30 Å,
wherein:
the first electrode includes an aluminum (Al)-based reflective layer including a first element and nickel (Ni), a transparent conductive layer, and a second-element-containing zinc oxide layer sequentially stacked in this order on the substrate such that the second-element-containing zinc oxide layer is closest to the organic layer,
the first element includes at least one of lanthanum (La), cerium (Ce), praseodymium (Pr), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu),
the transparent conductive layer includes indium tin oxide (ITO) or tin oxide ($SnO_2$),
the second-element-containing zinc oxide layer includes at least one of aluminum (Al), indium (In), gallium (Ga), germanium (Ge), gadolinium (Gd), zirconium (Zr), molybdenum (Mo), and nickel (Ni), and
the Al-based reflective layer includes an $Al_xNi$ phase, x being about 2.5 to about 3.5.

2. The organic light-emitting device as claimed in claim 1, wherein the $Al_xNi$ phase contacts the transparent conductive layer.

3. The organic light-emitting device as claimed in claim 1, wherein x is about 3.

4. The organic light-emitting device as claimed in claim 1, further comprising a nickel (Ni)-rich oxide layer on a surface of the Al-based reflective layer that faces the transparent conductive layer.

5. The organic light-emitting device as claimed in claim 1, wherein nickel (Ni) is included in the Al-based reflective layer in an amount of about 0.6 wt % to about 5 wt %.

6. The organic light-emitting device as claimed in claim 1, wherein the first element is lanthanum (La).

7. The organic light-emitting device as claimed in claim 1, wherein the first element is included in the Al-based reflective layer in an amount of about 0.1 wt % to about 3 wt %.

8. The organic light-emitting device as claimed in claim 1, wherein:
the Al-based reflective layer includes lanthanum (La), nickel (Ni), and aluminum (Al),
the lanthanum (La) is included in the Al-based reflective layer in an amount of about 0.1 wt % to about 3 wt %, and
the nickel (Ni) is included in the Al-based reflective layer in an amount of about 0.6 wt % to about 5 wt %.

9. The organic light-emitting device as claimed in claim 1, wherein the carbonaceous material is $C_{60}$.

10. The organic light-emitting device as claimed in claim 1, wherein the second element includes aluminum (Al).

11. The organic light-emitting device as claimed in claim 1, wherein the second element is included in the second element-containing zinc oxide layer in an amount of about 0.5 to about 10 parts by weight, based on 100 parts by weight of the second element-containing zinc oxide layer.

12. An organic light-emitting device, comprising:
a substrate;
a first electrode on the substrate;
a second electrode;
an organic layer between the first electrode and the second electrode; and
a carbonaceous material-containing layer between the first electrode and the organic layer,
wherein:
the first electrode includes an aluminum (Al)-based reflective layer, a transparent conductive layer sequentially stacked in this order on the substrate and a nickel (Ni)-rich oxide layer on a surface of the Al-based reflective layer that faces the transparent conductive layer, the Al-based reflective layer including a first element and nickel (Ni) and the first element includes at least one of lanthanum (La), cerium (Ce), praseodymium (Pr), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

13. The organic light-emitting device as claimed in claim 12, wherein the Al-based reflective layer includes an $Al_xNi$ phase, x being about 2.5 to about 3.5.

14. The organic light-emitting device as claimed in claim 12, wherein the $Al_xNi$ phase contacts the transparent conductive layer.

15. The organic light-emitting device as claimed in claim 12, wherein nickel (Ni) is included in the Al-based reflective layer in an amount of about 0.6 wt % to about 5 wt %.

16. The organic light-emitting device as claimed in claim 12, wherein the first element is lanthanum (La).

17. The organic light-emitting device as claimed in claim 12, wherein the carbonaceous material-containing layer includes a carbonaceous material including at least one of a fullerene-based compound, a metal-containing fullerene-based complex, carbon nanotubes, carbon fiber, carbon black, graphite, carbine, $MgC_{60}$, $CaC_{60}$, and $SrC_{60}$.

18. The organic light-emitting device as claimed in claim 12, wherein the first electrode further includes a second element-containing zinc oxide layer, the second element in the second element-containing zinc oxide layer including at least one of aluminum (Al), indium (In), gallium (Ga), germanium (Ge), gadolinium (Gd), zirconium (Zr), molybdenum (Mo), and nickel (Ni).

19. The organic light-emitting device as claimed in claim 12, wherein the carbonaceous material-containing layer having a thickness of about 3 Å to about 30 Å.

* * * * *